United States Patent
Nishio et al.

(10) Patent No.: US 8,064,236 B2
(45) Date of Patent: Nov. 22, 2011

(54) MEMORY MODULE, METHOD FOR USING SAME AND MEMORY SYSTEM

(75) Inventors: Yoji Nishio, Chuo-ku (JP); Atsushi Hiraishi, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 345 days.

(21) Appl. No.: 12/477,501

(22) Filed: Jun. 3, 2009

(65) Prior Publication Data

US 2009/0303768 A1 Dec. 10, 2009

(30) Foreign Application Priority Data

Jun. 4, 2008 (JP) ................................ 2008-147150

(51) Int. Cl.
*G11C 5/02* (2006.01)
(52) U.S. Cl. .............. 365/51; 365/52; 365/63; 257/777; 257/780; 326/26; 326/30
(58) Field of Classification Search .............. 365/51, 365/52, 63; 257/777, 780; 326/26, 30
See application file for complete search history.

(56) References Cited

U.S. PATENT DOCUMENTS

| | | | |
|---|---|---|---|
| 7,161,378 B2 | 1/2007 | Kang et al. | |
| 7,342,411 B2 | 3/2008 | Vergis et al. | |
| 7,928,757 B2 * | 4/2011 | Nguyen et al. | 326/30 |
| 2005/0270875 A1 | 12/2005 | Saeki | |
| 2009/0224822 A1 * | 9/2009 | Alzheimer et al. | 327/534 |

FOREIGN PATENT DOCUMENTS

| | | |
|---|---|---|
| JP | 2005-346625 A | 12/2005 |
| JP | 2006-129423 A | 5/2006 |
| JP | 2007-164787 A | 6/2007 |
| JP | 2008-46797 A | 2/2008 |

* cited by examiner

*Primary Examiner* — Vu Le
*Assistant Examiner* — Han Yang
(74) *Attorney, Agent, or Firm* — Sughrue Mion, PLLC

(57) ABSTRACT

In a multi-rank memory module having a terminal resistance of a data input/output pad 13 and a terminal resistance control pad 14 that inputs a signal that controls on/off of the terminal resistance, a high-speed operation is enabled with the aid of an enclosed terminal resistance, even in cases where the number of ranks is greater than that of terminal resistance control terminals (ODT terminals) provided on the memory module. To this end, a terminal resistance control pad 14 of a memory chip 12, having a longer length of an interconnect between a data bus 19 on a module substrate 8 and a data input/output pad 13, is connected to a terminal resistance control interconnect 18 or 21 to control the on/off of the terminal resistance from the ODT terminal. A terminal resistance control pad on a memory chip 11, having a shorter length of an interconnect between the data bus 19 on the module substrate and the data input/output pad 13, is connected to a fixed potential 20 to turn on the terminal resistance.

15 Claims, 23 Drawing Sheets

DATA RATE   1333Mbps @pad

MEMORY MODULE, METHOD FOR USING SAME AND MEMORY SYSTEM

REFERENCE TO RELATED APPLICATION

This application is based upon and claims the benefit of the priority of Japanese patent application No. 2008-147150, filed on Jun. 4, 2008, the disclosure of which is incorporated herein in its entirety by reference thereto.

FIELD OF THE INVENTION

This invention relates to a memory module. More particularly, it relates to a memory module having mounted thereon a memory chip including an enclosed terminal resistance which may be controlled on or off from outside.

BACKGROUND

In a server or a personal computer, large capacity semiconductor memories, such as dynamic RAMs, are used in larger quantities. In a system employing these memories in larger quantities, it is a frequent practice that a plurality of memory chips is mounted once on a memory module, which memory module is then plugged into a module socket provided in the system. The purpose of doing so is to assure facilitated memory extension and exchanges. The demand from the market for higher operating speeds and larger capacities is rather strong with these memory modules.

To increase the operating speed of the memory module, the memory module that uses a synchronous memory to speed up data transfer between the memory and the information processor, such as CPU, has come to be used. With the synchronous memory, a memory controller that controls the synchronous memory is provided on the information processor side. The memory controller transmits read or write commands to the synchronous memory in synchronization with a clock from the memory controller so that data may be read out from or written in the memory based on these commands. The inner part of the synchronous memory is pipelined so that the commands sequentially supplied from the memory controller are executed in parallel. In connection with the memory module, employing the synchronous memory, such a system has made its debut in which a terminal resistance is enclosed within a semiconductor memory chip and in which the terminal resistance is controlled to be turned on or off to reduce signal reflections to speed up the data transfer. For example, in DDR2-SDRAM (Double Data Rate 2-Synchronous DRAM) or DDR3-SDRAM (Double Data Rate 3-Synchronous DRAM), a terminal resistance is enclosed at a DQ (data input/output) terminal or a DQS (data strobe) terminal. In addition, a terminal resistance control terminal (On-Die Termination terminal, acronymed to ODT terminal) is provided to control the on/off of the enclosed terminal resistance from outside. With the use of the ODT terminal, the terminal resistance may be controlled from the memory controller to increase the transfer rate.

On the other hand, to enlarge the capacity of the memory module, development of a multi-rank memory module that loads a plurality of memory chips of a plurality of ranks in a single memory module is progressing. The rank is a unit of the memory chips to which a command may be afforded independently from the memory controller side. In the case of a memory module that connects to a data bus of 72 bits composed of 64 data bits and 8 ECC bits, 72/4=18 memory chips are needed in order to have access simultaneously to the 72-bit data, if the memory chip is of a 4-bit formulation. These 18 memory chips are loaded in a 1-rank memory module, whereas a doubled number of memory chips, that is, 36 memory chips, are loaded in a 2-rank memory module. The memory controller affords rank-based write and read commands, no matter whether the memory module is of a single-rank formulation or a multiple-rank formulation. If the memory controller side affords a command as it specifies the rank, the memory chip of the rank, the command is to be afforded to, is selected by a chip select signal from the memory chips of a plurality of ranks, and the command is afforded to the so selected memory chips of the rank of interest.

The semiconductor memory, having enclosed therein the terminal resistance, or the memory module or system, employing the semiconductor memory, having enclosed therein a terminal resistance, is disclosed in Patent Documents 1 and 2. The method for connecting the memory module in a memory system that is able to cope with larger capacities or higher operating speeds is disclosed in Patent Documents 3 and 4.

A memory system, employing a 2-rank memory module, in which the values of the enclosed terminal resistance are dynamically switched, is disclosed in Patent Document 5.

[Patent Document 1] JP Patent Kokai Publication No. JP-P2006-129423A

[Patent Document 2] JP Patent Kokai Publication No. JP-P2008-46797A

[Patent Document 3] JP Patent Kokai Publication No. JP-P2005-346625A

[Patent Document 4] JP Patent Kokai Publication No. JP-P2007-164787A

[Patent Document 5] U.S. Pat. No. 7,342,411

SUMMARY

The disclosures of the above Patent Documents 1 to 5 are incorporated herein by reference thereto.

An analysis of a related art by the present invention will be given below.

If the number of the ranks of the memory modules is to be increased to provide for a larger capacity, there may be cases where the number of the terminal resistance control terminals (ODT terminals), provided at the outset on the memory module, falls short. It is not readily allowed to increase the number of the ODT terminals of the memory module because it means changes in memory module design statements to lead to loss of compatibility with conventional memory modules.

On the other hand, it is not desirable for a plurality of ranks to share an ODT terminal because it may then not be possible to exercise optimum control of the terminal resistances.

If the use of the enclosed terminal resistance is given up, it may not be possible to suppress signal reflections, so that high speed data transfer cannot be realized.

It is thus desirable to develop a multi-rank memory module in which a number of ranks of memory chips exceeding the number of the terminal resistance control terminals (ODT terminals), provided from the outset on the memory module, may be loaded and in which moreover data may be transferred at a high speed.

In one aspect, the present invention provides a multi-rank memory module comprising a module substrate; a data bus provided on the module substrate; a plurality of synchronous memory chips; a number of terminal resistance control terminals smaller than the number of the ranks; and a number of terminal resistance control interconnects each provided on the module substrate in association with each of the terminal resistance control terminals. The synchronous memory chips each include a data input/output pad connected via an interconnection (i.e., wiring) to the data bus, an enclosed terminal resistance that terminates connection to the data bus, and a terminal resistance control pad for inputting a signal that controls the on/off of the enclosed terminal resistance. The synchronous memory chips are provided in terms of a rank as a unit of the memory chips to which a command is afforded independently from outside. The terminal resistance control pad for the memory chip out of the multiple memory chips that has a shorter length of the interconnection is connected to a fixed potential to turn on the enclosed terminal resistance. The terminal resistance control pad of the memory chip out of the memory chips that has a longer length of the interconnection is connected to the terminal resistance control interconnect.

In another aspect the present invention provides a multi-rank memory module comprising a module substrate, a data bus provided on the module substrate, a plurality of synchronous memory chips, a number of terminal resistance control terminals smaller than the number of the ranks, and a number of terminal resistance control interconnects each provided on the module substrate in association with each of the terminal resistance control terminals. Each synchronous memory chip includes a data input/output pad connected to the data bus, an enclosed terminal resistance that terminates connection to the data bus, and a terminal resistance control pad for inputting a signal that controls on/off of the enclosed terminal resistance. The synchronous memory chips are provided in terms of a rank as a unit of the memory chips to which a command is afforded independently from outside. The terminal resistance control pad of the memory chip out of the memory chips that is disposed on a lower layer close to the module substrate is connected to a fixed potential to turn on the enclosed terminal resistance. The terminal resistance control pad for the memory chip out of the memory chips that is disposed at an upper layer is connected to the terminal resistance control interconnects.

In a further aspect, the present invention provides a method for using the multi-rank memory module, wherein each of the memory chips further includes a mode register that sets a resistance value of the enclosed terminal resistance at the time of execution of a write command and a resistance value of the enclosed terminal resistance at the time other than the time of execution of the write command. The value of the terminal resistance of the memory chip, the terminal resistance control pad of which has been connected to a fixed potential, is set beforehand in the mode register so that the value of the terminal resistance at a time other than the time of execution of a write command is infinity and the value of the terminal resistance at the time of execution of the write command is a first value smaller than infinity. The value of the terminal resistance at the time of execution of the write command is set to the first value, and that at the time other than the time of execution of the write command is set to infinity.

In yet another aspect, the present invention provides a memory system comprising an interconnect substrate, an information processor mounted on the interconnect substrate and including a memory controller, and a plurality of memory module sockets for plugging in of the modules. The multi-rank memory module is plugged in at least one of the memory module sockets. The interconnect substrate includes a common data bus routed from the memory controller and a plurality of branched data buses routed from the terminal end of the common data bus to data bus connection terminals of the memory module sockets. The interconnect lengths of the branched data buses is equal to one another.

The meritorious effects of the present invention are summarized as follows.

According to the present invention, a number of ranks of the memory chips exceeding the number of the terminal resistance control terminals (ODT terminals), provided at the outset on the memory module, may be loaded, while data may be transferred at a high speed.

BRIEF DESCRIPTIONS OF THE DRAWINGS

PREFERRED MODES OF THE INVENTION

Figure 2:
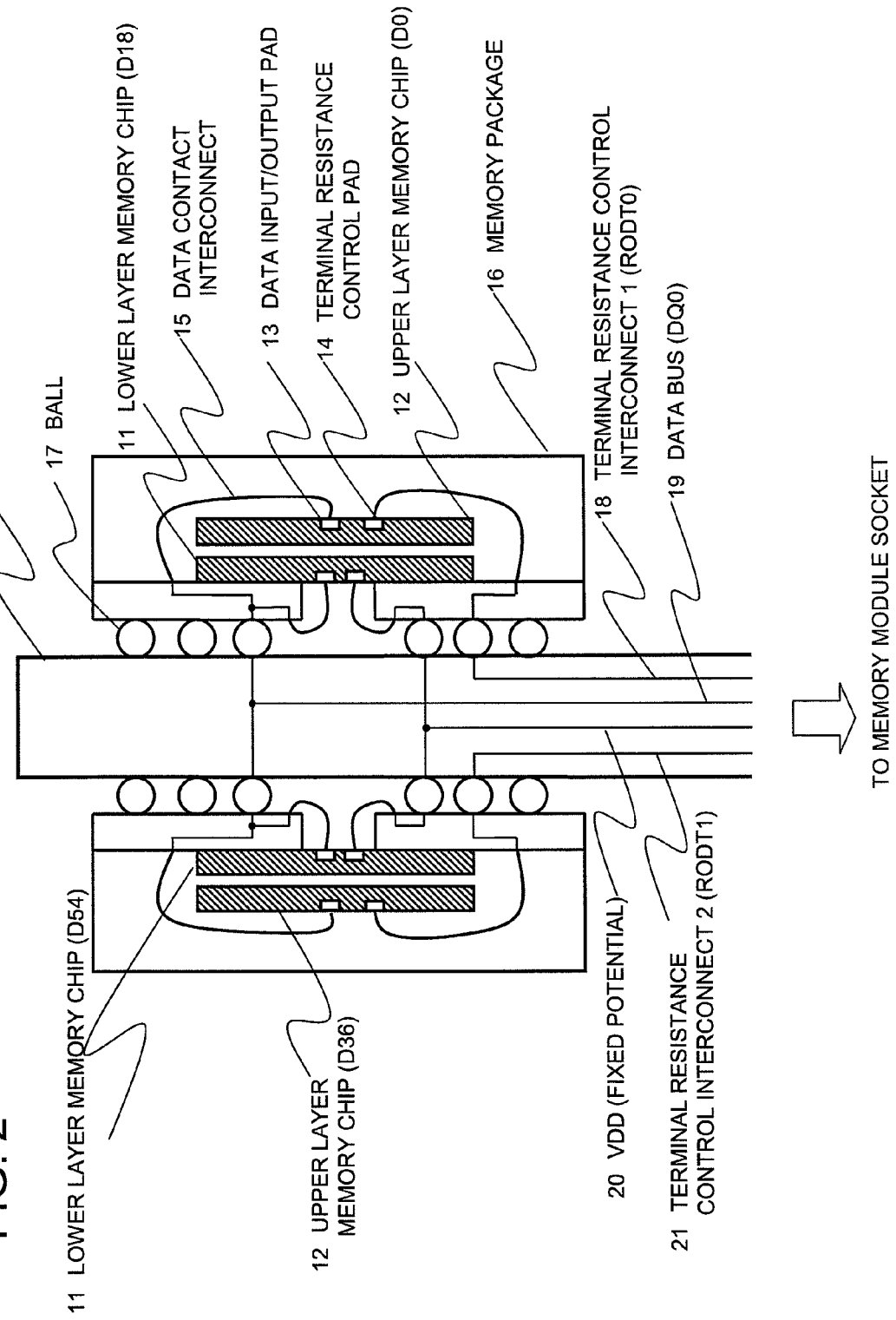
FIG. 2 is a cross-sectional view showing essential portions of a multi-rank memory module according to an exemplary embodiment of the present invention.
Figure 3:
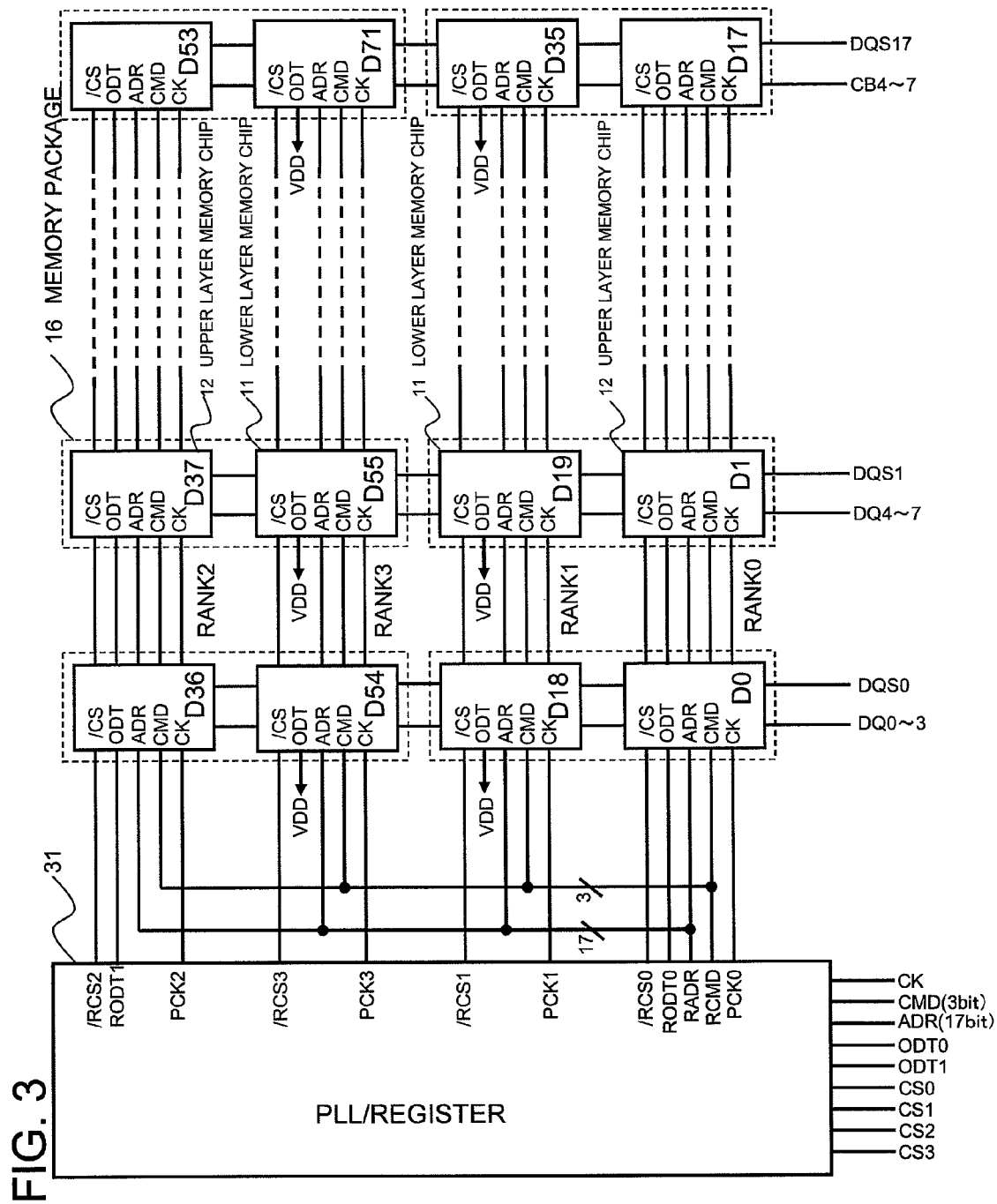
FIG. 3 is a schematic view of a system of the entire multi-rank memory module according to an exemplary embodiment of the present invention.
Figure 21:
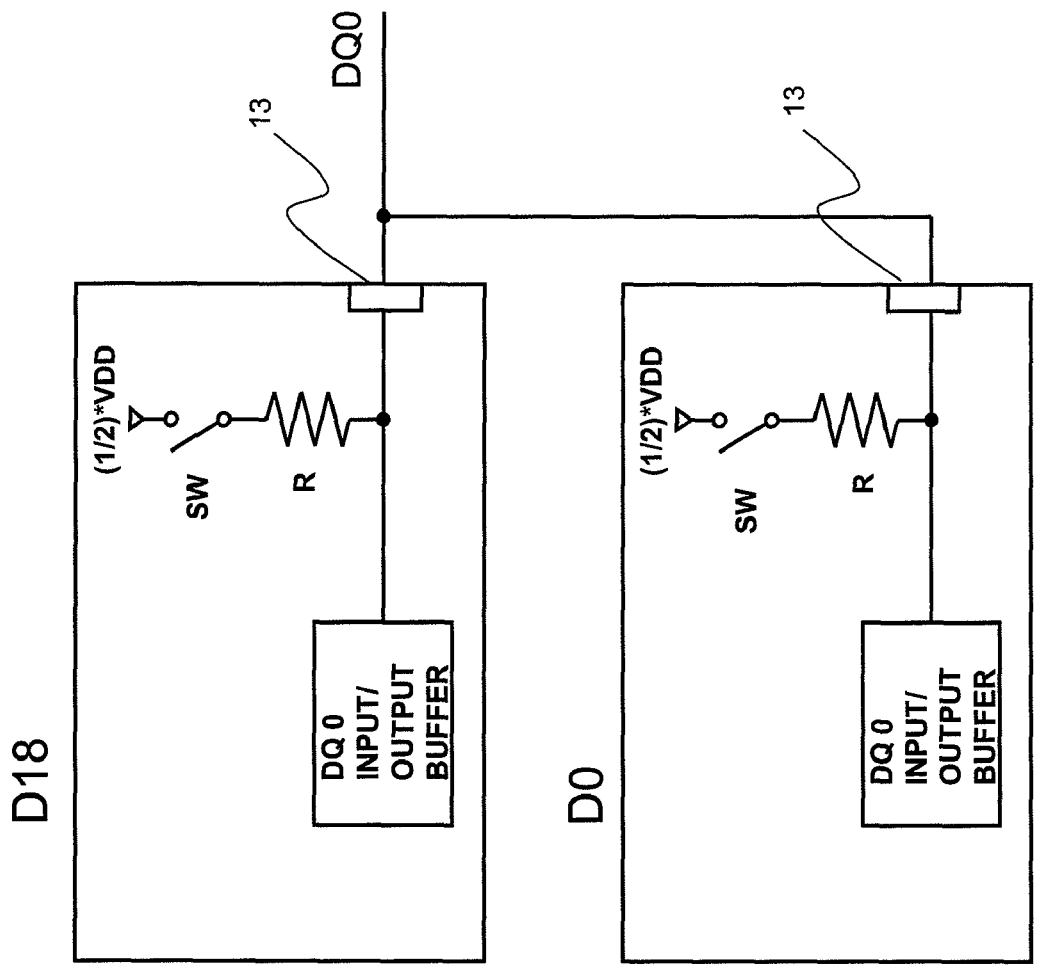
FIG. 21 is a connection diagram for connection of a data bus to an inner part of a memory chip according to an exemplary embodiment of the present invention.

An exemplary embodiment of the present invention will now be described with reference to the drawings where necessary. Referring to FIGS. 2, 3 and 21, a multi-rank memory module according to an exemplary embodiment of the present invention includes a module substrate (8), a data bus (19) provided on the module substrate, a plurality of synchronous memory chips (D0, D18, D54, D36), a number of terminal resistance control terminals (ODT0, ODT1) smaller than the number of the ranks, and a number of terminal resistance control interconnects (RODT0, RODT1), each provided on the module substrate in association with each of the terminal resistance control terminals. The synchronous memory chips each include a data input/output pad (13) connected via an interconnection (15) to the data bus, an enclosed terminal resistance (R) that terminates connection to the data bus, and a terminal resistance control pad (14) that inputs a signal controlling the on/off of the enclosed terminal resistance. The synchronous memory chips are provided in terms of a rank as a unit of the memory chips to which a command is afforded independently from outside. The terminal resistance control pad for the memory chip (11) out of the memory chips that has a shorter length of the interconnection is connected to a fixed potential (VDD) to turn on the enclosed terminal resistance. The terminal resistance control pad (14) of the memory chip (12) out of the memory chips that has a longer length of the interconnection is connected to the terminal resistance control interconnects (18, 21).

Or, as shown in FIG. 2, the synchronous memory chips (D0 and D18 or D54 and D36) are loaded in layers on a module substrate (8). The terminal resistance control pads of the memory chips (D18, D54) out of the multiple memory chips, disposed on a lower layer close to the module substrate, are connected to the fixed potential (VDD) to turn on the enclosed terminal resistance. On the other hand, the terminal resistance control pads (14) for the memory chips out of the memory chips, disposed at an upper layer, are connected to the terminal resistance control interconnects (18, 21).

Referring to FIG. 2, a multi-rank memory module according to an exemplary embodiment may be so configured that a plurality of the memory chips (11, 12) are stacked in layers on each of the front and back sides of the module substrate (8), the terminal resistance control pads (14) of the memory chips (11) provided on respective lower layers of the front and back sides are connected to the fixed potential (20), and so that the terminal resistance control pads (14) of the memory chips (12) provided on respective upper layers of the front and back sides are connected to respective corresponding terminal resistance control interconnects (18, 21).

Referring to FIG. 2, showing an exemplary embodiment of a multi-rank memory module, a plurality of memory chips (11, 12), stacked in layers, are arranged in a package (16), and mounted in this state on the substrate (8). The data input/output pad (13) is connected to a data input/output terminal of the package (16) and connected via the input/output terminal of the package to the data bus (19).

Referring to FIG. 3, showing an exemplary embodiment of a multi-rank memory module, each of the memory chips (such as D0, D18, D36 and D54) includes a chip select terminal (/CS). The memory module receives chip select signals (CS0 to CS3) from outside to select a chip select terminal (/CS) of one of the memory chips (D0, D18, D36 and D54) that is to receive a command.

Referring to FIG. 3, the multi-rank memory module according to an exemplary embodiment of the present invention may further comprise a register (31) for storage of signals (CK, CMD, ADR, ODT0, ODT1, CS0, CS1, CS2 and CS3) including addresses and commands received from outside, and a phase synchronization circuit (31) that adjusts the timing of the signals stored in the register (31) to afford the resulting signals to the memory chips. The terminal resistance control terminals (ODT0, ODT1) are connected via the register (31) to the terminal resistance control interconnects (RODT0, RODT1).

A multi-rank memory module according to an exemplary embodiment may be used as the terminal resistance values are set as shown in any of Tables 1, 2, 4 and 5.

Figure 13:
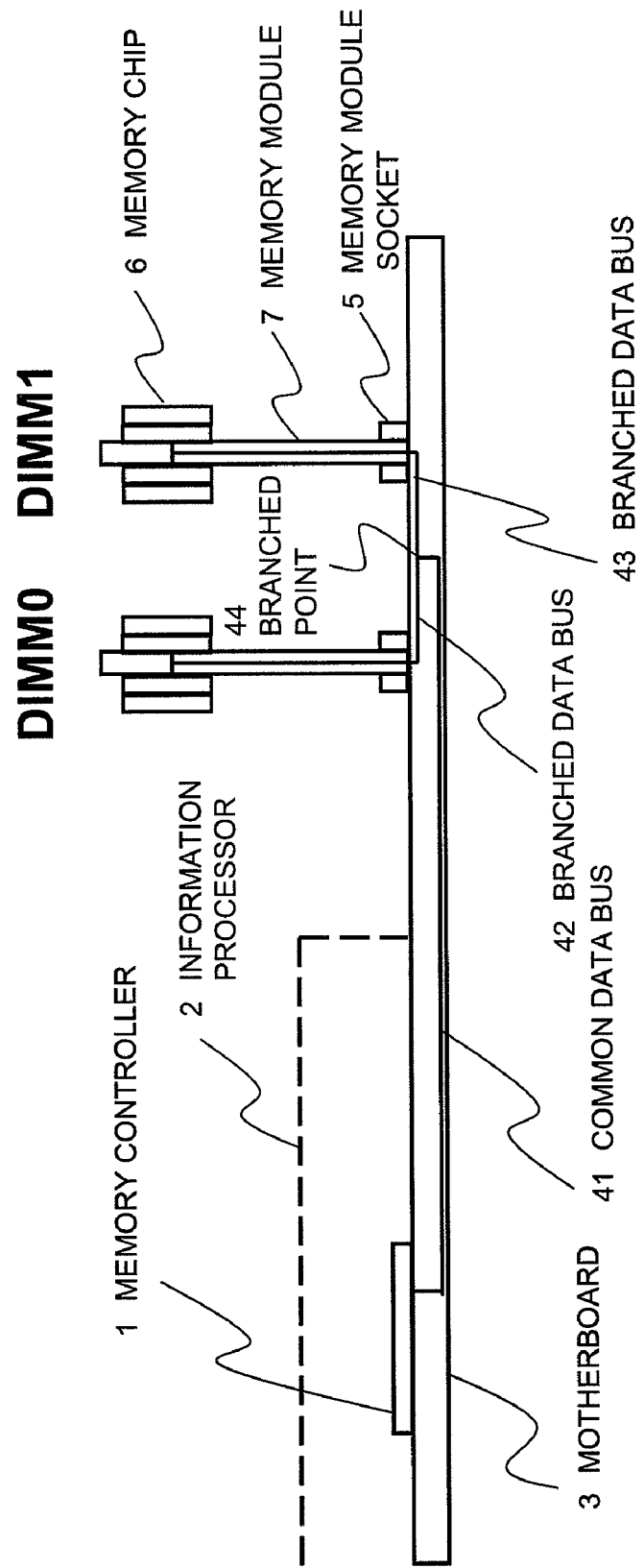
FIG. 13 is a schematic view of an entire memory system in another exemplary embodiment (T-branch system) of the present invention.

Referring to FIG. 13, a memory system according to an exemplary embodiment of the present invention comprises an interconnect substrate (3), an information processor (2) mounted on the interconnect substrate (3) and including a memory controller (1), and a plurality of memory module sockets (5) in which a plurality of memory modules (7) are adapted to be plugged. At least one of multi-rank memory modules (7) is adapted to be plugged in at least one of the memory module sockets (5). The interconnect substrate (3) includes a common data bus (41) routed from the memory controller (1) and a plurality of branched data buses (42, 43) routed from the terminal end (44) of the common data bus to data bus connection terminals of the memory module sockets (5). The routing and interconnection are selected so that the interconnect lengths of the branched data buses (42, 43) will be equal to one another.

Figure 22:
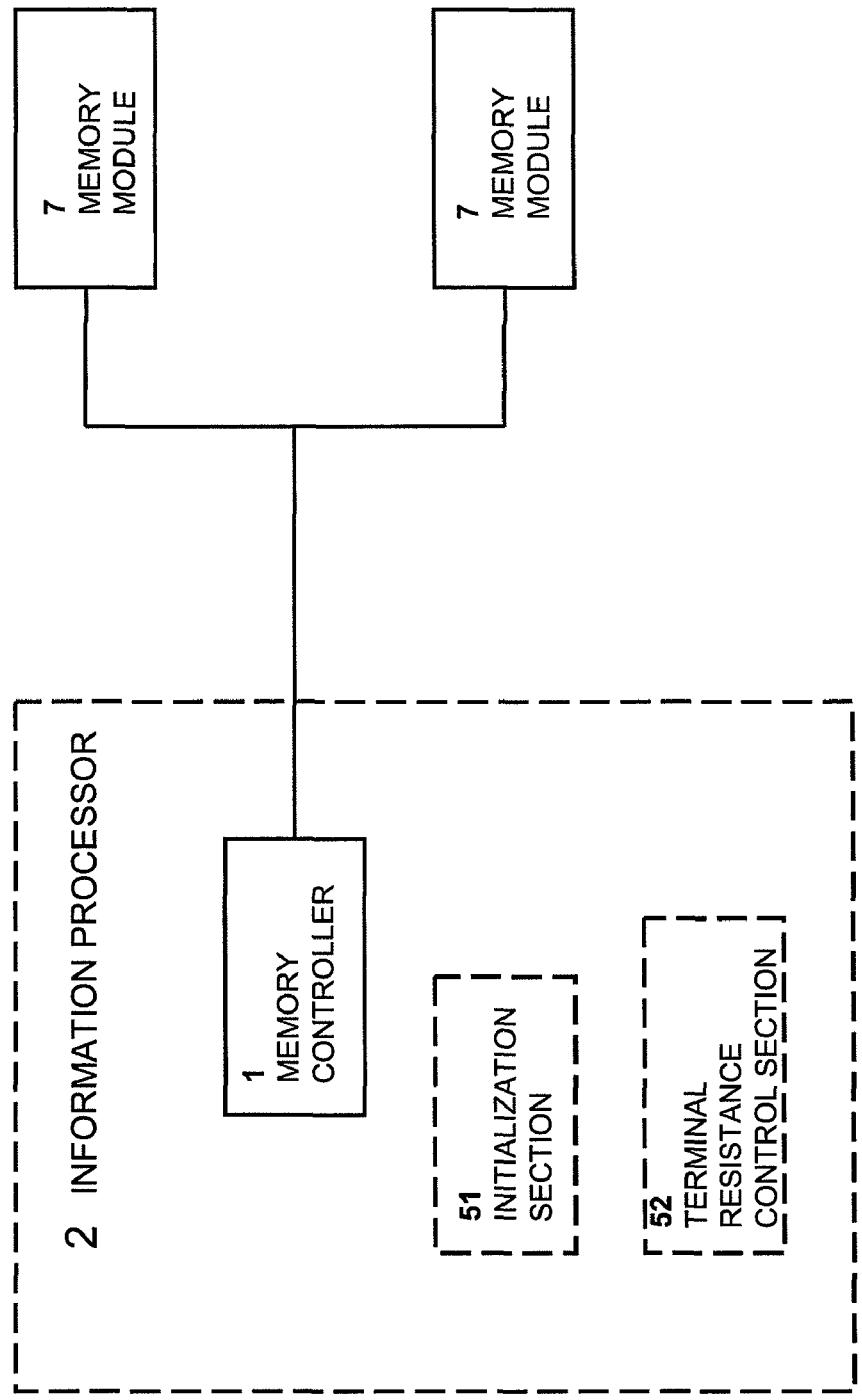
FIG. 22 is a block diagram of an information processor in an exemplary embodiment of the present invention.

Referring to FIG. 22, the memory system according to the exemplary embodiment may include an initial-setting section (51) and a terminal resistance controlling section (52).

More specified exemplary embodiments will now be described with reference to the drawings.

Figure 1:
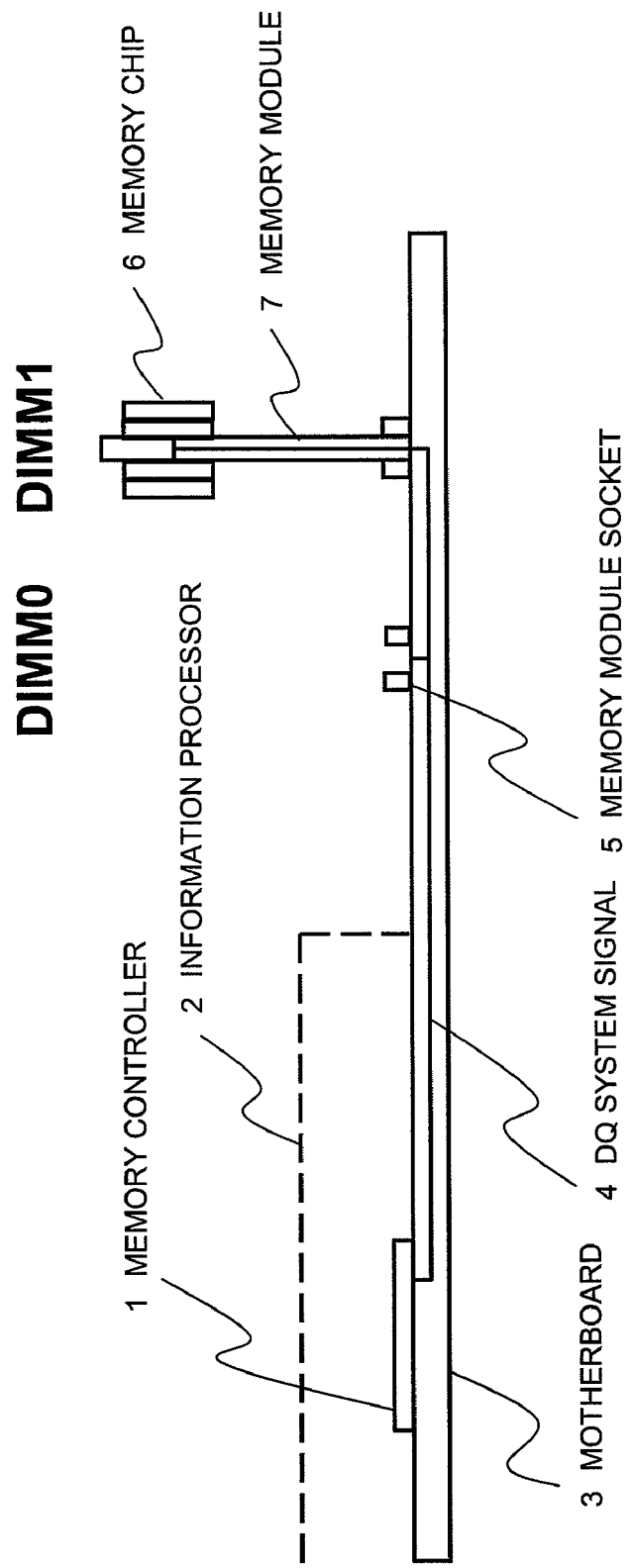
FIG. 1 is a schematic view of an entire memory system.

FIG. 1 depicts a schematic view of an entire memory system. The memory system, shown in FIG. 1, is used for a main memory of a computer system, such as that of a server or a personal computer, or for a part controlling the main memory. On a motherboard 3, there are provided a memory controller 1, as a part of an information processor 2, and a plurality of memory module sockets 5 in which to plug-in a plurality of memory modules 7. The memory module is plugged in at least one of the multiple memory modules 5. The memory modules 7 are preferably those of the DIMM (Dual Inline Memory Module) standard, only for purposes of illustration. A plurality of memory chips 6 are mounted in the memory modules 7.

Although the multiple memory module sockets 5 for memory modules 7 are provided in the motherboard 3, only one memory module socket 5 for the memory module may suffice, depending on the particular system used. The memory modules 7 may also be directly soldered to the motherboard without the intermediary of the memory module sockets 5 for the memory modules. In FIG. 1, two memory module sockets 5 for the memory modules, that is, DIMM0 and DIMM1, are mounted, and interconnects for DQ system signals 4 from the memory controller 1 to the memory module sockets 5 are routed via the memory module socket for DIMM0 to the memory module socket for DIMM1 in accordance with the so-called fly-by system.

FIG. 22 depicts a block diagram of the information processor 2. It is noted that, in FIG. 22, there is shown in particular a part of the constitution of the information processor 2 relevant to controlling of the memory modules 7. The memory controller 1 directly controls the memory modules 7. The information processor 2 writes data in and reads out data from the memory modules 7 via the memory controller 1. The information processor 2 includes an initial setting section 51 and a terminal resistance control section 52. The initial setting section 51 is used to generate initial setting data of a mode register of a memory chip loaded on the memory module, and the terminal resistance control section 52 controls the value of a terminal resistance of the memory module 7. These sections 51, 52 may also be built within the memory controller 1. A CPU, not shown, contained in the information processor 2, may be adapted to run a firmware program stored in a memory, also not shown, provided separately from the memory module 7. The CPU may thus perform the functions of the initial setting section 51 and the terminal resistance control section 52. Although the memory controller 1 of the information processor 2 is preferably mounted on the motherboard 3, it is unnecessary to mount other parts of the information processor 2 directly on the motherboard.

FIG. 2 depicts a cross-sectional view of an essential part of a multi-rank memory module according to an exemplary embodiment of the present invention. Referring to FIG. 2, a memory package 16 is mounted on each side of a module substrate 8. Within the memory package 16 are mounted a lower layer memory chip 11 and an upper layer memory chip 12, stacked together. The lower layer memory chip 11 and the upper layer memory chip 12 are the same memory chips. A pad for the lower layer memory chip 11 and a pad for the upper layer memory chip 12 are connected by wire bonding to interconnects on a chip loading substrate within the memory package. The interconnects of the chip loading substrate are connected via electrically conductive balls 17 to an interconnect pattern provided in the module substrate 8. In particular, a data input/output pad 13 of each of the lower layer memory chip 11 and the upper layer memory chip 12 is connected via a data contact interconnect 15 to a data bus 19. It is observed that, of the lower layer memory chip 11 and the upper layer memory chip 12, the upper layer memory chip has an interconnection interconnecting the data input/output pad 13 and the data bus 19 longer in length than that of the lower layer memory chip.

It is observed that the upper layer memory chip 12 and the lower layer memory chip 11 may be directly mounted on the module substrate 8 without the intermediary of the memory package. In this case, the data input/output pad 13 of the lower layer memory chip may be directly connected to the data bus 19 only with the intermediary of the electrically conductive balls 17. If it is possible to directly connect the data input/output pad 13 and the data bus 19 by ultrasonic welding, thus without the intermediary of even the electrically conductive balls 17, they may be so connected. In such case, the junction surface of the data input/output pad 13 and the data bus 19 functions as an interconnection interconnecting the data input/output pad 13 and the data bus 19.

FIG. 21 depicts a connection diagram for connecting a data bus to the inside of the memory chip in an exemplary embodiment of the present invention. Specifically, FIG. 21 shows only memory chips D0 and D18, loaded on one side of the module substrate 8, as typical of four memory chips (D18, D0, D54 and D36) a data bus DQ0 is connected to. With both the two memory chips D0, D18, a data input/output pad 13, connected to the data bus DQ0, is connected to a DQ0 input/output buffer and to an enclosed terminal resistance R within the inside of the memory chip. The opposite end of each of the enclosed terminal resistance R is connected via a switch to (½)*VDD, which is an intermediate potential between a power supply voltage VDD and a ground potential GND (0V).

The resistance values of the enclosed terminal resistance R may be set by setting on a mode register provided within the memory chip. Also, the on/off of the switch SW may be controlled from outside by a write command and a voltage level of a signal afforded to a terminal resistance control pad 14 shown in FIG. 2. If the voltage applied to the terminal resistance control pad 14 is the VDD level (HIGH level) and there is no incoming write command, the value of the enclosed terminal resistance is of the value Rtt_Nom. If the voltage applied to the terminal resistance control pad 14 is the VDD level (HIGH level) and there is an incoming write command, the value of the enclosed terminal resistance may be Rtt_Wr. On the other hand, if the signal applied to the pad 14 is the GND level (LOW level), the value of the enclosed terminal resistance may be infinite ($\infty$). The value Rtt_Nom may be set to infinity depending on mode register setting.

Referring to FIG. 2, two terminal resistance control pads 14 for two upper layer memory chips 12 (D0 and D36) are connected respectively to terminal resistance control interconnects 18, 21. The voltages at the terminal resistance control interconnects 18, 21 are determined by a terminal resistance control signal output by the memory controller. Hence, the resistance value of the enclosed terminal resistance R of the upper layer memory chip 12 may be controlled by the terminal resistance control signal and a write command from the memory controller.

On the other hand, the terminal resistance control pad 14 of the lower layer memory chip is fixed at VDD. Hence, the resistance value of the terminal resistances R of the lower layer memory chip may be controlled by a write command from the memory controller.

FIG. 3 depicts a diagram showing an entire system of a multi-rank memory module of an exemplary embodiment 1. Referring to FIG. 3, the formulation of the entire multi-rank memory module of the exemplary embodiment 1 is explained. The memory module of FIG. 3 is of a so-called Registered DIMM formulation composed of a PLL/register 31 and 72 4-bit memory chips D0 to D71. The PLL/register 31 includes a register that temporarily holds a clock signal CK, a 3-bit command signal CMD, a 17-bit address signal ADR, terminal resistance control signals ODT0, ODT1 and chip select signals CS0 to CS3 and that re-drives these signals. It is observed that these signals are transmitted to the PLL/register from the memory controller, not shown.

The signals temporarily held by the resister have the signal skew adjusted by the PLL (Phase Locked Loop, or phase synchronization circuit) so as to be then output to the memory chips D0 to D71. Meanwhile, PCK0 to PCK3 are timing-adjusted clock signals. RCMD is a timing-adjusted command signal CMD, and RADR is a timing-adjusted address signal. RODT0 and RODT1 are timing-adjusted versions of the terminal resistance control signals ODT0 and ODT1. /RCS0, /RCS1, /RCS2 and /RCS3 are timing-adjusted versions of the chip select signals CS0, CS1, CD2 and CS3, respectively. It is observed that the 3-bit command signal CMD is composed of a row address strobe signal /RAS, a column address strobe signal /CAS and a write enable signal /WE.

The 72 memory chips are enclosed in packages 16, at a rate of two chips in one package, and mounted in this state in the memory module. To one bit of the data bus DQ are coupled the data input/output pads 13 of a total of four memory chips contained in two memory packages. To these four memory chips is also afforded a common data strobe signal DQS from the memory controller. The data bus is composed of 64 bit data of DQ0 to DQ63 and 8 ECC bits of CB0 to CB7, so that the total of 72 bits of the bus are connected to a data bus of the motherboard.

18 of the memory chips that input one of the chip select signals /RCS0, /RCS1, /RCS2 and /RCS3 in common make up a rank. The memory chips D0 to D17 are of the rank 0, the memory chips D18 to D35 are of the rank 1, the memory chips D36 to D53 are of the rank 2, and the memory chips D54 to D72 are of the rank 3. Only the command entered when the corresponding chip select signal /RCS0, RCS1, RCS2 or /RCS3 is activated is valid. For the chip memories of the rank for which the chip select signal is not activated, read or write is not carried out even if a read command or a write command is entered. The ODT terminals of the rank 0 and rank 2 memory chips are supplied with corresponding ODT signals. The ODT terminals of the memory chips of the rank 1 and the rank 3 are fixed at VDD. It is observed that, in an example shown in FIG. 3, the memory chip is of the 4-bit constitution, and hence 18 1-rank memory chips are needed. If an 8-bit memory chip is used, the number of the memory chips needed is halved, that is, 9 memory chips will suffice. Meanwhile, if no ECC bit is used, one rank is formed by 16 4-bit memory chips.

Specified setting of the enclosed terminal resistance will now be described with reference to Examples.

Example 1

Table 1 shows an Example for setting of the enclosed terminal resistance that may be used with advantage in executing a write command as the memory module of the above-described exemplary embodiment 1 is applied to DDR3 4 Rank Registered DIMM. In Table 1, it is supposed that the memory module of the present invention is applied to DIMM1 of the motherboard 3 as shown in FIG. 1. On one of the front and back sides of the module substrate 8, shown in FIG. 2, there is mounted a memory package composed of a rank 1 memory chip and a rank 0 memory chip stacked together. On the other side of the module substrate 8, there is mounted a memory package composed of a rank 2 memory chip and a rank 3 memory chip stacked together. The memory chips of the ranks 0 and 2 form an upper layer, while those of the ranks 1 and 3 form a lower layer. Thus, as regards the memory chips of the ranks 0 and 2, forming the upper layer, and which have longer lengths of interconnections that interconnect the memory chips to the data bus, the values of the enclosed terminal resistance R may dynamically be controlled from the memory controller by controlling the ODT terminal (terminal resistance control pad 14) and the write command. On the other hand, as regards the memory chips of the ranks 1 and 3, forming the lower layer, and which have shorter lengths of interconnections that interconnect the memory chips to the data bus, the values of the enclosed terminal resistance R may dynamically be controlled from the memory controller by the write command, because the ODT terminal (terminal resistance control pad 14) is fixed at the VDD potential.

TABLE 1

| | | | | DDR3 DIMM ODT | | | | | | | | |
|---|---|---|---|---|---|---|---|---|---|---|---|---|
| | | | MCH | DIMM0 | | | | DIMM1 | | | | |
| DIMM0 | DIMM1 | Write To | ODT | Rank 0 | Rank 1 | Rank 2 | Rank 3 | Rank 0 | Rank 1 | Rank 2 | Rank 3 |
| Empty | 4 Rank | DIMM1-Rank 0 | OFF | | | | | 120 Ω | OFF | 40 Ω | OFF |
| | | DIMM1-Rank 1 | OFF | | | | | OFF | 120 Ω | 40 Ω | OFF |
| | | DIMM1-Rank 2 | OFF | | | | | 40 Ω | OFF | 120 Ω | OFF |
| | | DIMM1-Rank 3 | OFF | | | | | 40 Ω | OFF | OFF | 120 Ω |

(Remarks)
Rtt_Nom of Ranks 0 and 2 is set to 40 Ω, Rtt_Nom of Ranks 1 and 3 is set to infinity and Rtt_WR is unexceptionally set to 120Ω.

In the above Table 1, MCH ODT is a value of the enclosed terminal resistance of the memory controller 1. Also, in the setting of the above Table 1, the function of the dynamic ODT, which is among the functions of the DDR3 SDRAM, is used. The dynamic ODT is such a function in which, with an ODT signal delivered as an input, the enclosed terminal resistance (Rtt_WR value) at the time of execution of the write command may be set to a value different from the terminal resistance (Rtt_Nom value) at the time other than the time of execution of the write command. Detailed discussions on this dynamic ODT may be found in the above referenced Patent Document 5.

In this Example, all of the memory chips of the ranks 0 to 3 are set so as to use the functions of the dynamic ODT based on initial setting of the mode register. With any of the memory chips of the ranks 0 to 3, the enclosed terminal resistance at the time of execution of the write command is set to a value different from the terminal resistance at the time other than the time of execution of the write command. Specifically, the enclosed terminal resistance (Rtt_WR value) at the time of execution of the write command is 120Ω for any of the memory chips of the ranks 0 to 3. On the other hand, the terminal resistance (Rtt_Nom value) at the time other than the time of execution of the write command is set to 40Ω for the ranks 0 and 2 and to infinity for the ranks 1 and 3. Hence, the enclosed terminal resistance of the memory chips of the ranks 1 and 3, for which the ODT terminal is fixed at VDD, is 120Ω at the time of executing a write command for the own ranks, and is infinity otherwise.

On the other hand, as regards the memory chips of the ranks 0 and 2, whether or not the values of the enclosed terminal resistance are as set by the mode register depends on the voltage level the memory controller affords to the ODT terminal. For the memory chip of the rank 0, the memory controller 1 exercises control so that the enclosed resistance is off during execution of the write command for the rank 1 and on during execution of the write command for the ranks 0, 2 and 3. Thus, referring to Table 1, the values of the terminal resistances are 120Ω (setting value of Rtt_WR) during execution of the write command for the rank 0, OFF during execution of the write command for the rank 1 and 40Ω (setting value of Rtt_Nom) during execution of the write command for the ranks 2 and 3. It is observed that the enclosed resistance of the memory chip of the rank 2 is OFF during execution of the write command for the rank 3 because the memory controller controls the resistance to be OFF.

Figure 4:
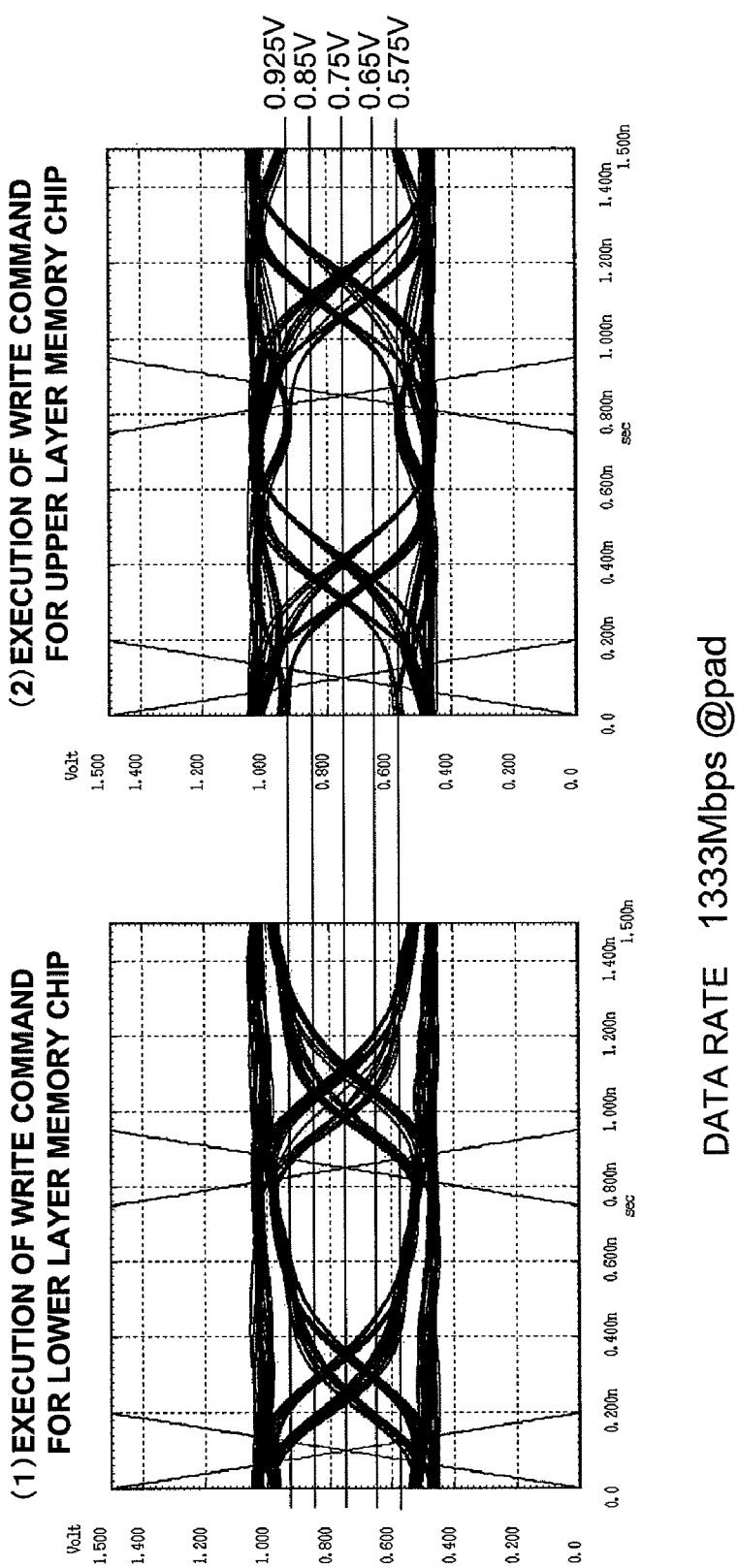
FIG. 4 is a graph showing a waveform at the time of execution of a write command according to Example 1 of the present invention.

FIG. 4 shows the results of simulation of the signal waveform of the data input/output pad of the memory chip that has controlled the enclosed terminal resistance in accordance with Table 1. FIG. 4 specifically shows the results of writing at the data rate of 1333 Mbps, and more specifically shows (1) a waveform on executing a write command for a lower layer memory chip and (2) a waveform on executing a write command for an upper layer memory chip. These waveforms indicate sufficient suppression of signal reflections and sufficient amplitudes as well as only little waveform variations. It has been confirmed that an eye pattern (size of an eye in an area between the rise and the fall of the waveform free of waveform overlap between high and low levels) is practically not of a problem.

Comparative Example 1

Figure 5:
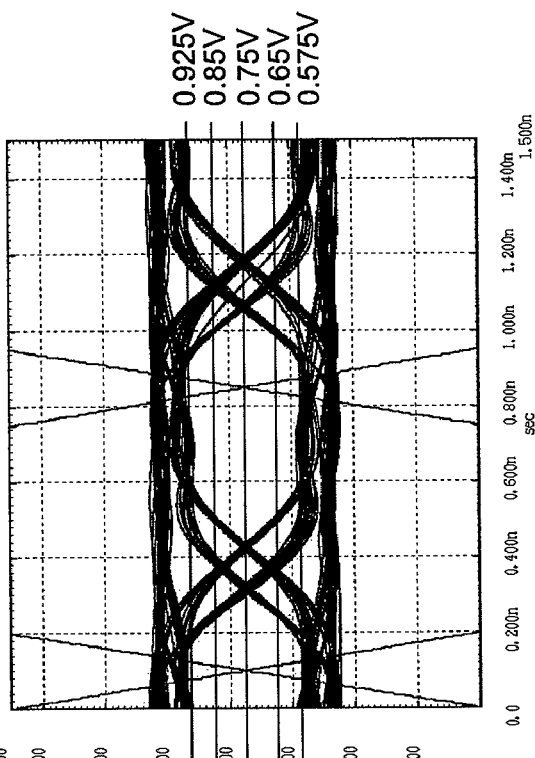
FIG. 5 is a graph showing a waveform at the time of execution of a write command in Comparative Example 1.
Figure 5:
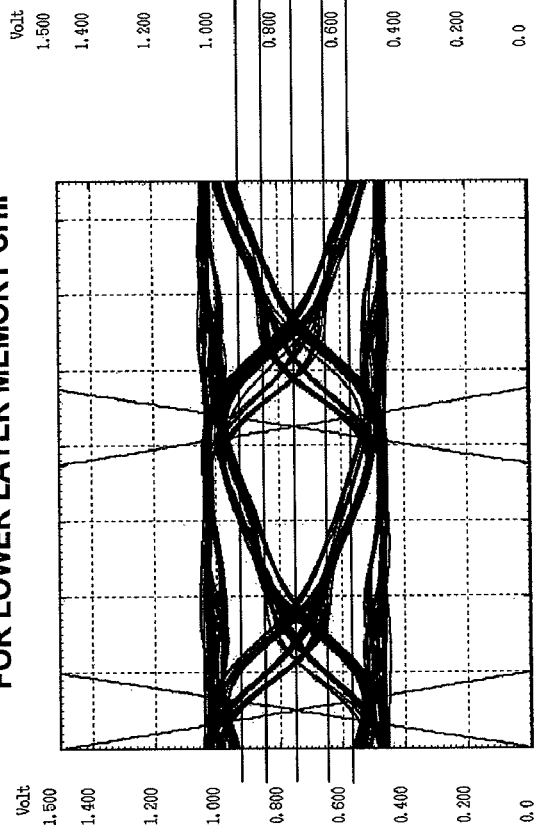
Figure 23:
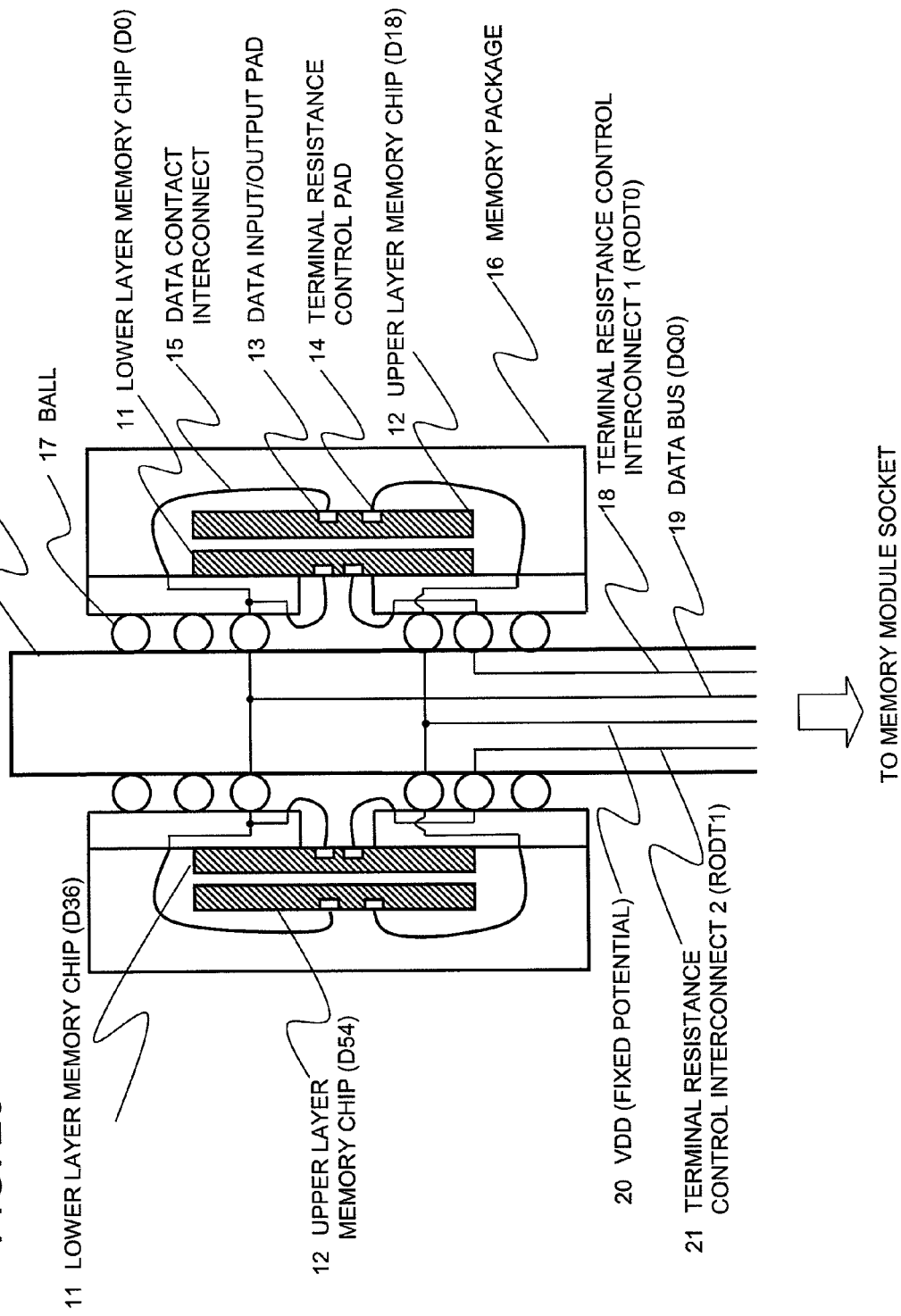
FIG. 23 is a cross-sectional view showing essential portions of a multi-rank memory module according to a Comparative Example.

A Comparative Example corresponding to the above Example 1 with the upper layer memory chip and the lower layer memory chip interchanged in connection with the ODT signal controlling method is now described. In this Comparative Example, the terminal resistance control pad 14 of the upper layer memory chip 12, with a longer length of the interconnection to the data bus, is fixed at VDD, while the terminal resistance control pad of the lower layer memory chip 11, with a shorter length of the interconnection to the data bus, is connected to the terminal resistance control interconnects 18, 21, as shown in FIG. 23. The memory chips of the ranks 1 and 3 are mounted on the upper layer, while those of the ranks 0 and 2 are mounted on the lower layer. FIG. 5 shows the results of the simulation conducted using unchanged the setting of the terminal resistances shown in Table 1, with the other conditions being the same as those in FIG. 4. Comparison of FIG. 5 to FIG. 4 indicates that the waveform shown in FIG. 5 is affected more strongly by signal reflections than that shown in FIG. 4, with the eye pattern of FIG. 5 being narrower than that of FIG. 4. It is thus seen that connection of the terminal resistance control pad of the lower layer memory chip to VDD (fixed potential), rather than connection of the terminal resistance control pad of the upper layer memory chip to VDD (fixed potential), leads to more marked reduction of signal reflections at the time of execution of the write command.

This may be accounted for in such a way that the interconnection that interconnects the data input/output pad to the data bus is longer in length with the upper layer chip than that with the lower layer chip, so that, if the value of the enclosed terminal resistance at the time of execution of the write command for ranks other than the own ranks is set to infinity, it is not possible to reduce signal reflections.

Example 2

Example 2 shows setting of the enclosed terminal resistance desirable in executing a read command. Table 2 below shows concrete examples of the enclosed terminal resistance.

TABLE 2

| | | | | DDR3 DIMM ODT | | | | | | | |
|---|---|---|---|---|---|---|---|---|---|---|---|
| | | | MCH | DIMM0 | | | | DIMM1 | | | |
| DIMM0 | DIMM1 | Read from | ODT | Rank 0 | Rank 1 | Rank 2 | Rank 3 | Rank 0 | Rank 1 | Rank 2 | Rank 3 |
| Empty | 4 Rank | DIMM1-Rank 0 | 60 Ω | | | | | OFF | OFF | OFF | OFF |
| | | DIMM1-Rank 1 | 60 Ω | | | | | OFF | OFF | OFF | OFF |
| | | DIMM1-Rank 2 | 60 Ω | | | | | OFF | OFF | OFF | OFF |
| | | DIMM1-Rank 3 | 60 Ω | | | | | OFF | OFF | OFF | OFF |

(Remarks)
Rtt_Nom of Ranks 0 and 2 is set to 40 Ω. Rtt_Nom of Ranks 1 and 3 is set to infinity and Rtt_WR is set unexceptionally to 120 Ω.

The setting in Example 2, inclusive of mode register setting, is the same as that of Example 1, unless otherwise stated. Example 2 differs from Example 1 in that the value of the enclosed terminal resistance MCHODT in the memory controller is set to 60%. The on/off of the enclosed terminal resistance in the memory controller may dynamically be controlled by the memory controller itself, such that the enclosed terminal resistance in the memory controller, turned off at the time of execution of the write command, is turned on at the time of execution of the read command. The enclosed terminal resistance of the memory chips of the rank 0 and the rank 2 is initial-setd at 40Ω, as explained in connection with Example 1. However, when executing the read command, the memory controller affords the ground potential (low level potential, hereinafter the same) to the ODT terminals (terminal resistance control pads 14) of the memory chips of the rank 0 and the rank 1, to turn off the enclosed terminal resistance, no matter from which rank memory chip readout is to be executed.

Figure 6:
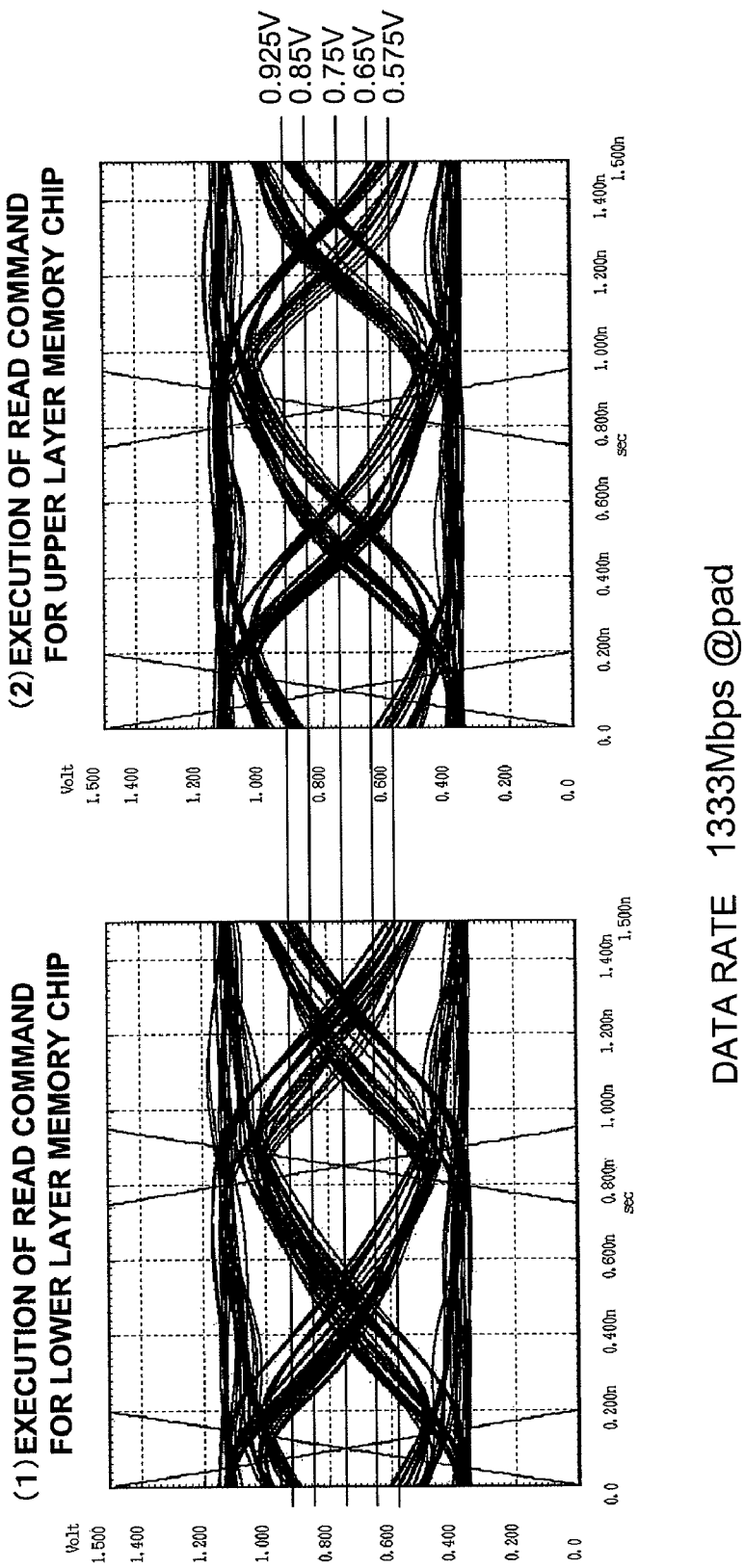
FIG. 6 is a graph showing the waveform at the time of execution of a read command in Example 2 of the present invention.

FIG. 6 shows the results, as found by simulation, of the signal waveforms at the data input/output terminal of the memory controller, as the enclosed terminal resistance are controlled as indicated in Table 2. The data rate is 1333 Mbps, as in Example 1. Thus, FIG. 6 shows (1) a waveform on executing a write command for an upper layer memory chip and (2) a waveform on executing a write command for a lower layer memory chip. These waveforms indicate sufficient suppression of signal reflections and sufficient amplitudes as well as only little waveform variations. It has been confirmed that an eye pattern is practically not of a problem.

Reference Example 1

For reference, an Example is shown, as Reference Example 1. In this Reference Example 1, the values of the enclosed terminal resistance at the time of execution of a write command (Rtt_WR value), and the values of the enclosed terminal resistance (Rtt_Nom value) for execution of other than the write command, initial-set beforehand by the memory controller in the mode register of each memory chip, are the same as in Examples 1 and 2. However, in this Reference Example 1, the dynamic on/off control for the ODT terminal of the memory chip (terminal resistance control pad 14) differs from that of the Examples 1 and 2. Table 3 shows the setting of the terminal resistances of the Reference Example 1.

module socket as well. The formulation of the memory modules DIMM0 and DIMM1 is the same as that in the exemplary

TABLE 3

| | | | | DDR3 DIMM ODT | | | | | | | |
|---|---|---|---|---|---|---|---|---|---|---|---|
| | | | MCH | DIMM0 | | | | DIMM1 | | | |
| DIMM0 | DIMM1 | Read from | ODT | Rank 0 | Rank 1 | Rank 2 | Rank 3 | Rank 0 | Rank 1 | Rank 2 | Rank 3 |
| Empty | 4 Rank | DIMM1-Rank 0 | 60 Ω | | | | | OFF | OFF | 40 Ω | OFF |
| | | DIMM1-Rank 1 | 60 Ω | | | | | OFF | OFF | 40 Ω | OFF |
| | | DIMM1-Rank 2 | 60 Ω | | | | | 40 Ω | OFF | OFF | OFF |
| | | DIMM1-Rank 3 | 60 Ω | | | | | 40 Ω | OFF | OFF | OFF |

(Remarks)
Rtt_Nom of Ranks 0 and 2 is set to 40 Ω, Rtt_Nom is set to infinity and Rtt_WR is set unexceptionally to 120 Ω.

When executing a read command from the memory chip of the rank 2 or 3, the potential of the rank 0 ODT terminal (terminal resistance control pad 14) is VDD (high level potential, hereinafter the same), thus in a manner different from Example 2. The terminal resistance for the rank 0 at this time is thus the resistance value 40Ω of Rtt_Nom. In similar manner, when executing a read command from the memory chip of the rank 0 or 1, the potential at the ODT terminal is controlled so that the terminal resistance of the rank 2 will also be turned on. Hence, the terminal resistance value of the rank 2 is the resistance value 40Ω of Rtt_Nom.

Figure 7:
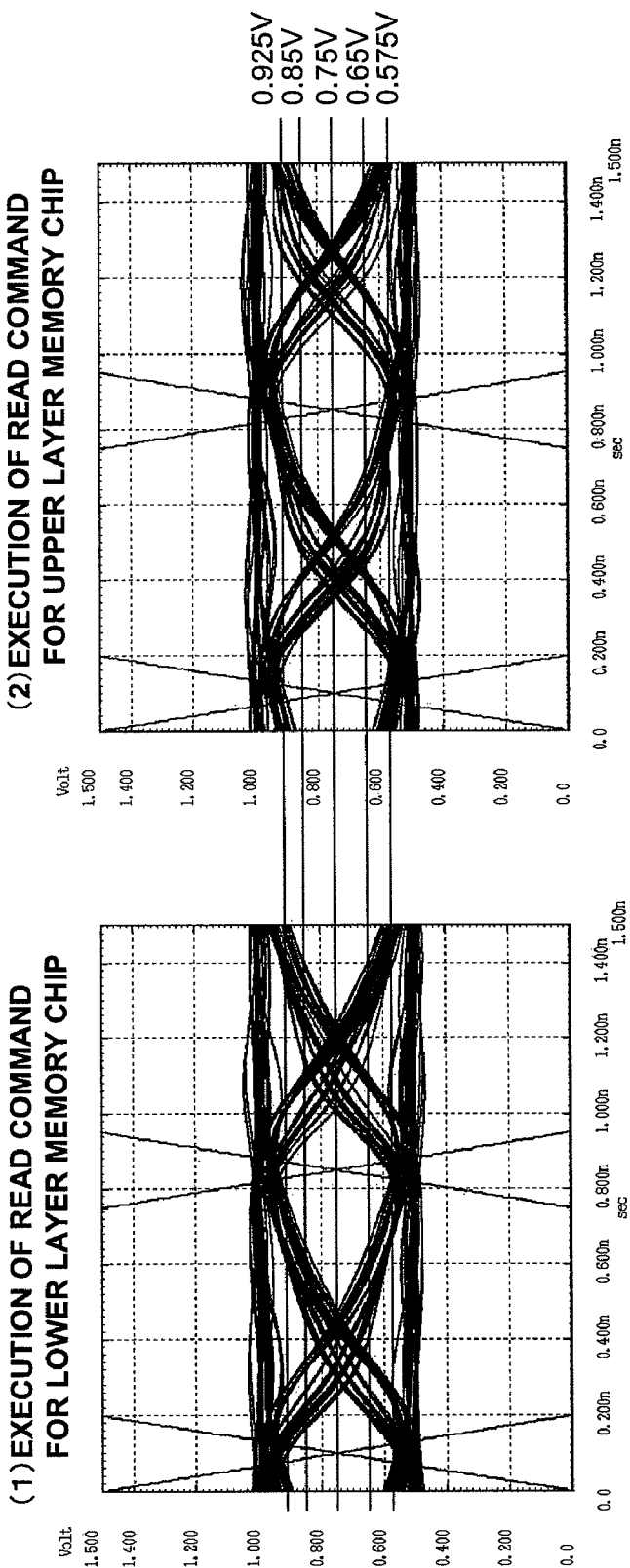
FIG. 7 is a graph showing the waveform at the time of execution of a read command in Reference Example 1 for the method of using a multi-rank memory module.

FIG. 7 shows the results, as found by simulation, of the signal waveform at the data input/output terminal of the memory controller in this Reference Example 1. Comparison of FIG. 7 to FIG. 6 of Example 2 indicates that the amplitude of the signal waveform is not sufficient, with the eye pattern being also narrow. It is seen also from FIG. 7 that, when executing the read command, it is desirable to dynamically control the ODT terminal from the memory controller and to turn off the terminal resistance.

Exemplary Embodiment 2

The explanation made so far refers to a case where only a single memory module has been mounted on the same data bus of a motherboard. An exemplary embodiment is now described in which a plurality of memory modules is mounted on the same data bus of the motherboard.

Figure 8:
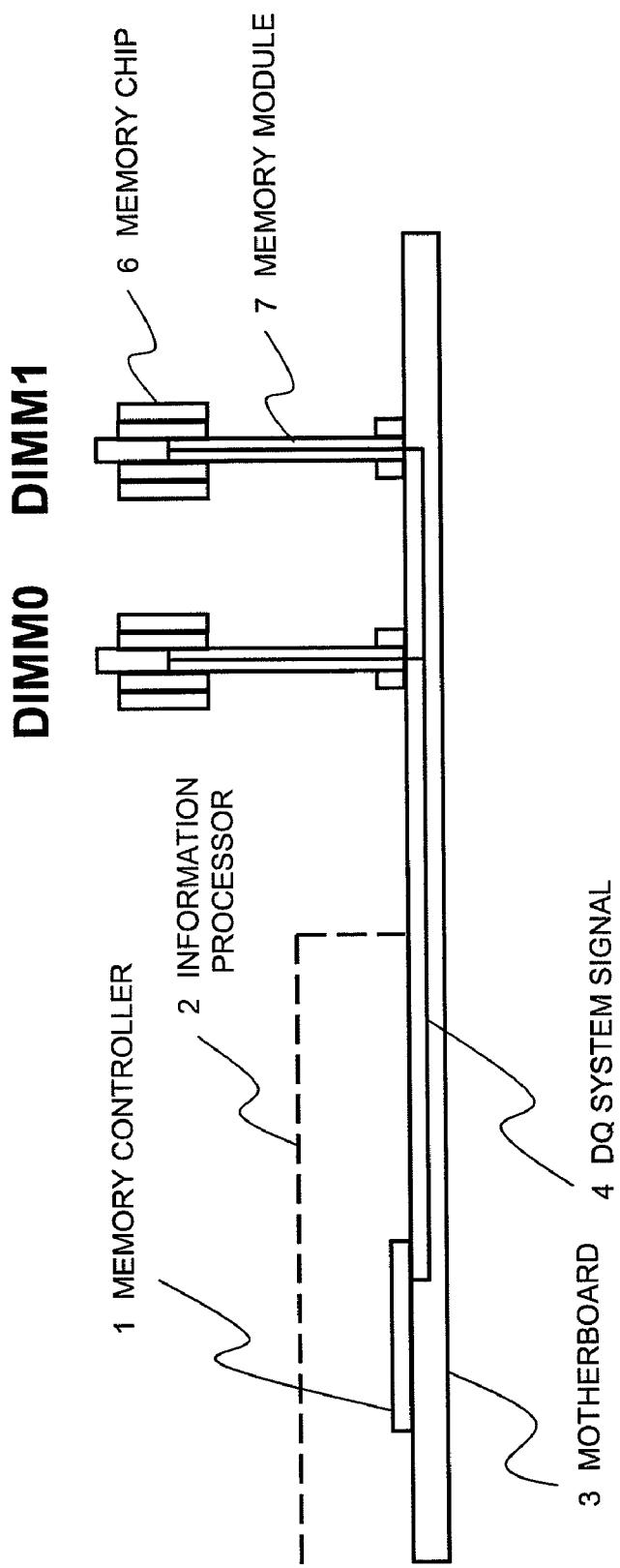
FIG. 8 is a schematic view of a system of an entire memory system when two memory modules of an exemplary embodiment of the present invention are plugged into corresponding slots.

FIG. 8 depicts a schematic view of an entire memory system in case two memory modules have been plugged in two corresponding slots. In FIG. 1, the sole memory module has been plugged in the DIMM1 memory module socket. In FIG. 8, the memory module is plugged in the DIMM0 memory module socket as well. The formulation of the memory modules DIMM0 and DIMM1 is the same as that in the exemplary embodiment 1. The interconnections of the DQ system signals 4 (data bus and so forth) on the motherboard 3 are made in accordance with the so-called fly-by system, as in the exemplary embodiment 1.

Example 3

Example 3 shows the setting of terminal resistances in case the memory system and the memory module of the exemplary embodiment 2 are applied to the DDR3 4-Rank Registered DIMM to effect writing on the memory chip. The formulation of the memory modules of DIMM0 and DIMM1 per se is the same as that of Example 1. Table 4 shows the setting of the values of the enclosed resistances for the memory chips of DIMM0 and DIMM1 at the time of execution of the write command.

TABLE 4

| | | | | DDR3 DIMM ODT | | | | | | | |
|---|---|---|---|---|---|---|---|---|---|---|---|
| | | | MCH | DIMM0 | | | | DIMM1 | | | |
| DIMM0 | DIMM1 | Write To | ODT | Rank 0 | Rank 1 | Rank 2 | Rank 3 | Rank 0 | Rank 1 | Rank 2 | Rank 3 |
| 4 Rank | 4 Rank | DIMM0-Rank 0 | OFF | 120 Ω | OFF | OFF | OFF | 40 Ω | OFF | 40 Ω | OFF |
| | | DIMM0-Rank 1 | OFF | OFF | 120 Ω | OFF | OFF | 40 Ω | OFF | 40 Ω | OFF |
| | | DIMM0-Rank 2 | OFF | OFF | OFF | 120 Ω | OFF | 40 Ω | OFF | 40 Ω | OFF |
| | | DIMM0-Rank 3 | OFF | OFF | OFF | OFF | 120 Ω | 40 Ω | OFF | 40 Ω | OFF |
| | | DIMM1-Rank 0 | OFF | 40 Ω | OFF | 40 Ω | OFF | 120 Ω | OFF | OFF | OFF |
| | | DIMM1-Rank 1 | OFF | 40 Ω | OFF | 40 Ω | OFF | OFF | 120 Ω | OFF | OFF |
| | | DIMM1-Rank 2 | OFF | 40 Ω | OFF | 40 Ω | OFF | OFF | OFF | 120 Ω | OFF |
| | | DIMM1-Rank 3 | OFF | 40 Ω | OFF | 40 Ω | OFF | OFF | OFF | OFF | 120 Ω |

(Remarks)
For both DIMM0 and DIMM1, Rtt_Nom for Ranks 0 and 2 is set to 40 Ω and Rtt_Nom for Ranks 1 and 3 is set to infinity, while Rtt_WR is unexceptionally set to 120 Ω.

The mode register setting is such that, for the memory chips of DIMM0 and DIMM1, the value of the enclosed terminal resistance (Rtt_WR value) at the time of executing the write command is 120Ω. The value of the enclosed terminal resistance (Rtt_Nom value) for other than write command execution is 40Ω for ranks 0 and 2 and infinity for ranks 1 and 3.

Furthermore, the memory controller controls the ODT terminals of the memory chips of the rank 0 and the rank 2 in the following manner. In executing a write command on the ranks being controlled of the DIMM being controlled, or in executing a write command for the other DIMM, the VDD level is afforded to the ODT terminal being controlled. On the other hand, in executing a write command on the other ranks of the DIMM being controlled, the GND level is afforded to the ODT terminal being controlled. For example, in executing the write command to any rank of the DIMM0-Rank0 or DMM1, the VDD level is afforded to the ODT terminal of the DIMM0-Rank0 (Rank 0 of DIMM0). In executing the write command on the DIMM-Rank1 to DIMM0-Rank3, the GND level is afforded. Thus, the values of the enclosed terminal resistances may be set as shown in Table 4, in accordance with the on/off control by the ODT terminals by the memory controller, the presence or non-presence of the write command and by the resistance values as set beforehand by the mode register.

Figure 9:
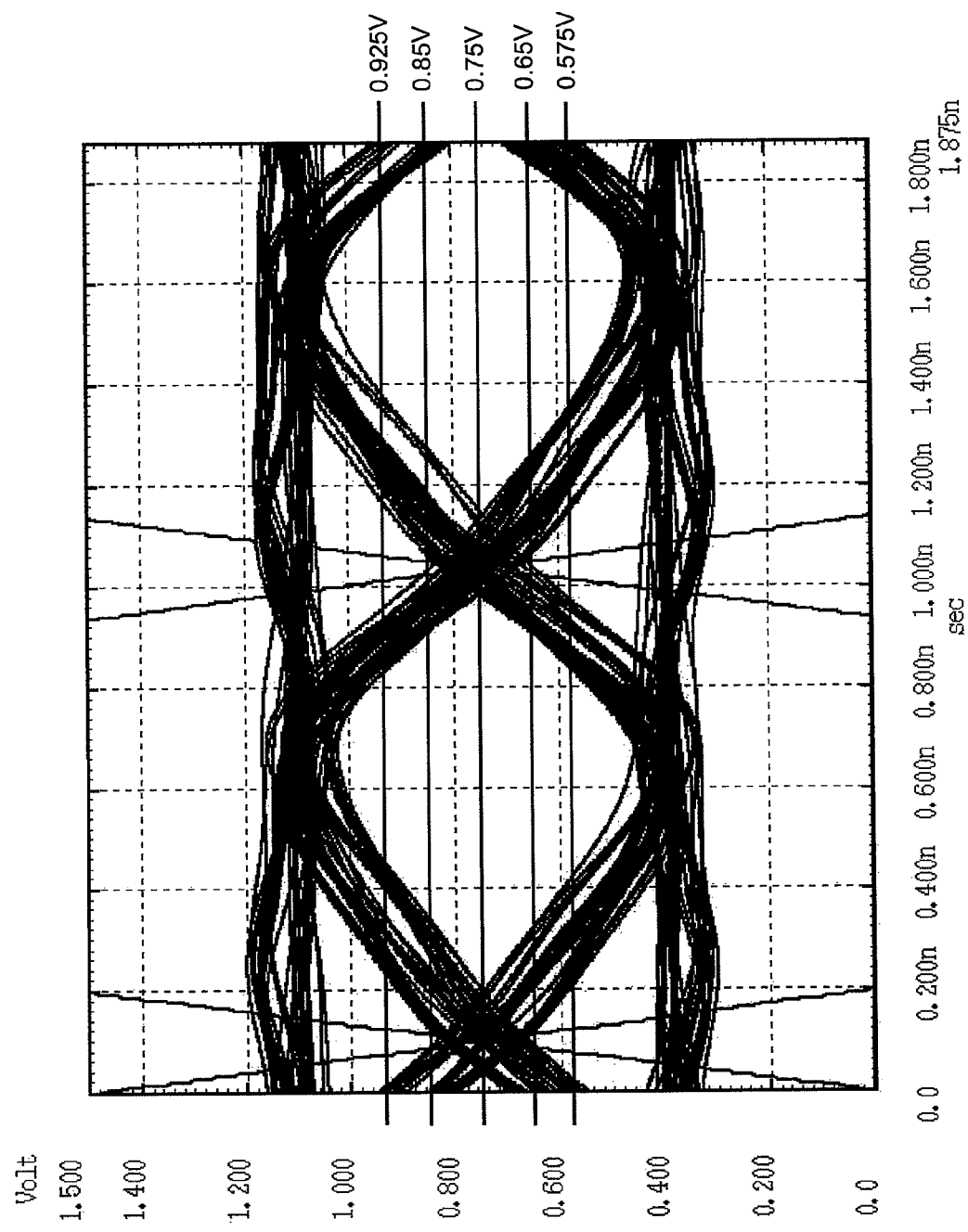
FIG. 9 is a graph showing the waveform at the time of writing in Example 3 of the present invention.
Figure 10:
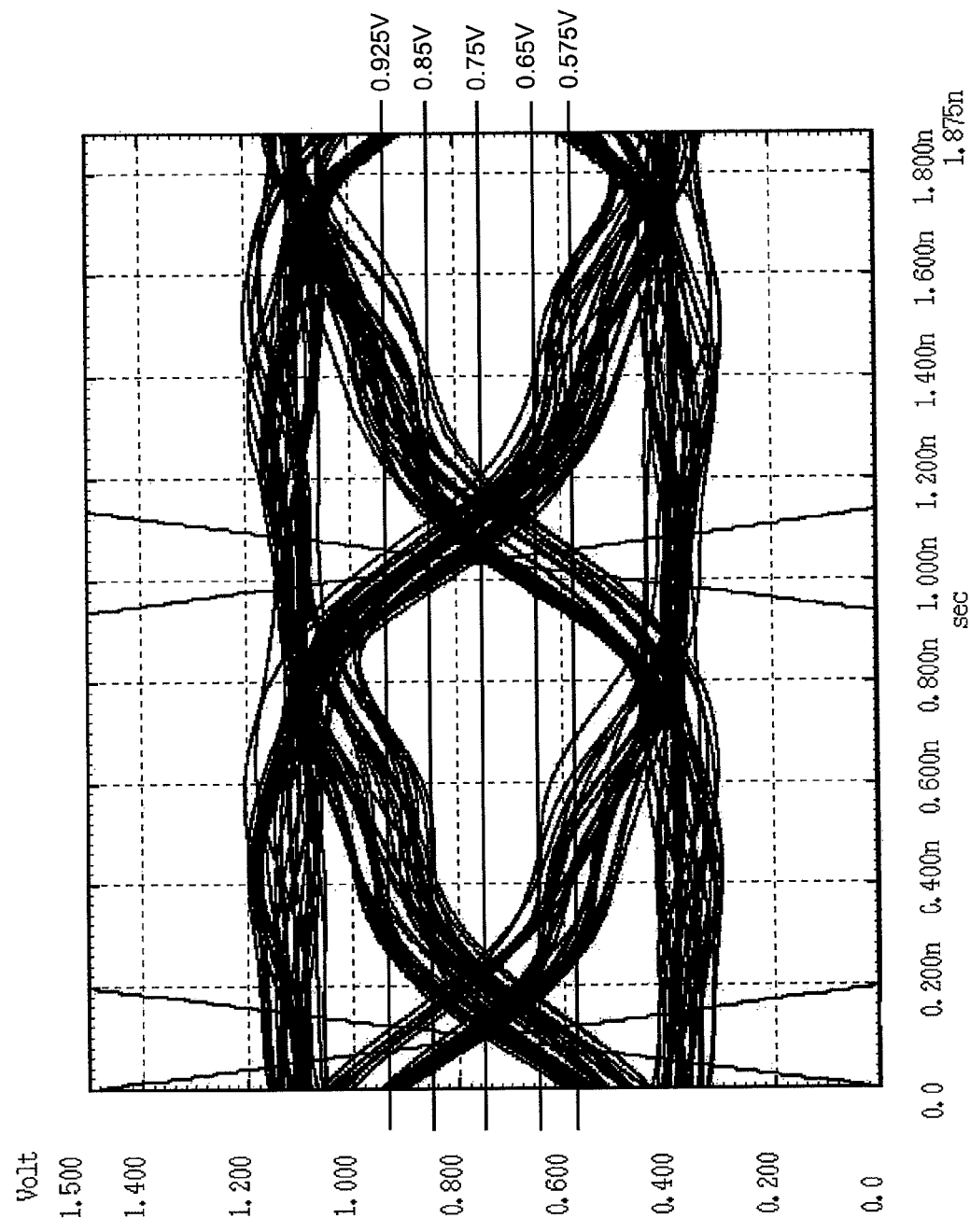
FIG. 10 is a graph showing the waveform at the time of writing in another slot in Example 3 of the present invention.

FIGS. 9 and 10 are graphs, as obtained by simulation, for showing signal waveforms at data input/output pads of the memory chip at this time. In these figures, writing is carried out at a data rate of 1066 Mbps. FIG. 9 depicts a signal waveform at the data input/output pad of the memory chip being written to when executing the write command on the upper layer memory chip (rank 0 or rank 2) of DIMM0. FIG. 10 depicts a signal waveform at the data input/output pad of the memory chip being written to when executing the write command on the upper layer memory chip (rank 0 or rank 2) of DIMM1. Comparison of FIGS. 9 and 10 indicates that, while the waveform for the memory chip of DIMM0 of FIG. 9 is not of a problem, the signal waveform for the memory chip of DIMM1 of FIG. 10 is slightly deteriorated.

Example 4

Figure 11:
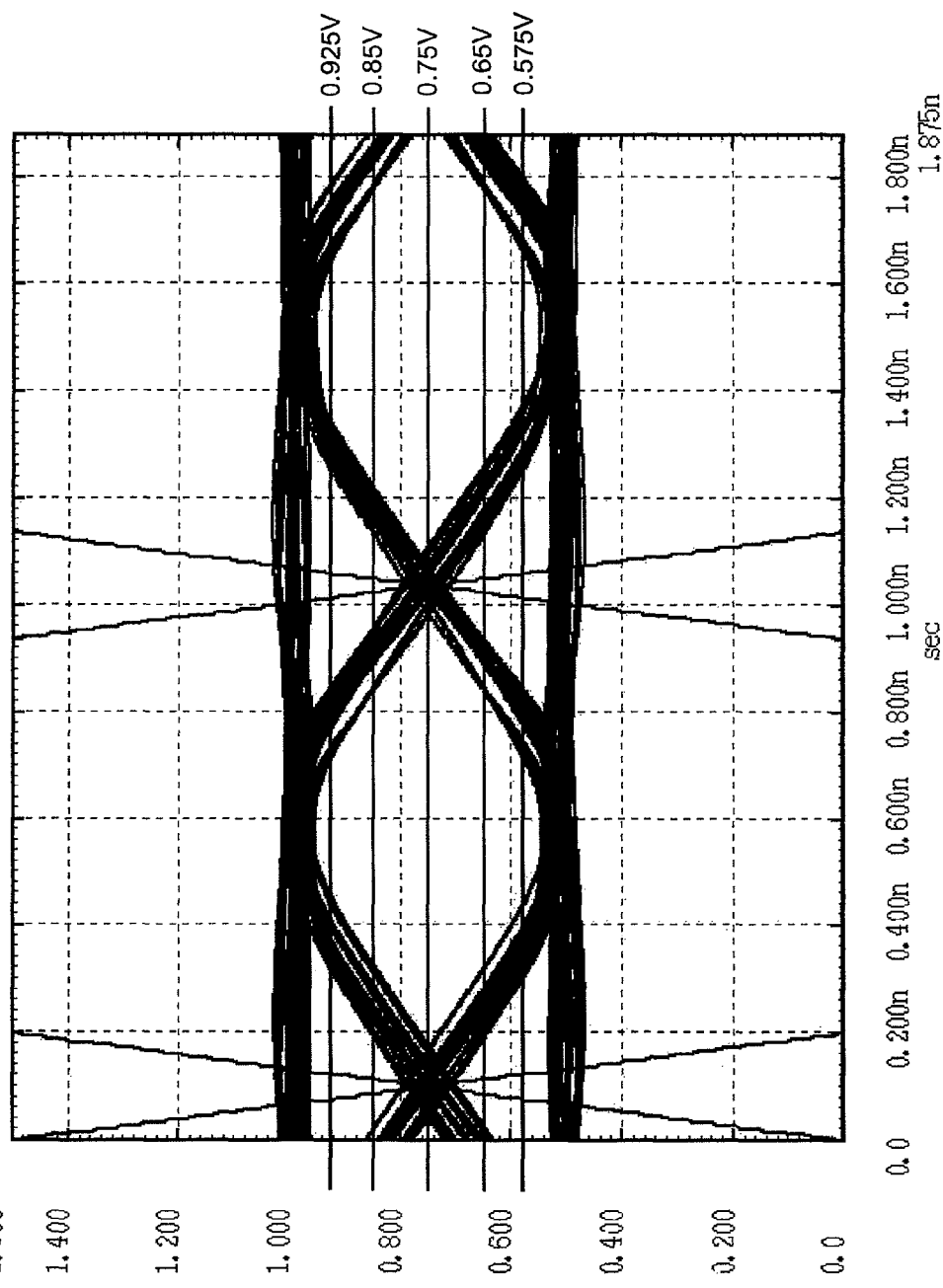
FIG. 11 is a graph showing the waveform at the time of readout in Example 4 of the present invention.
Figure 12:
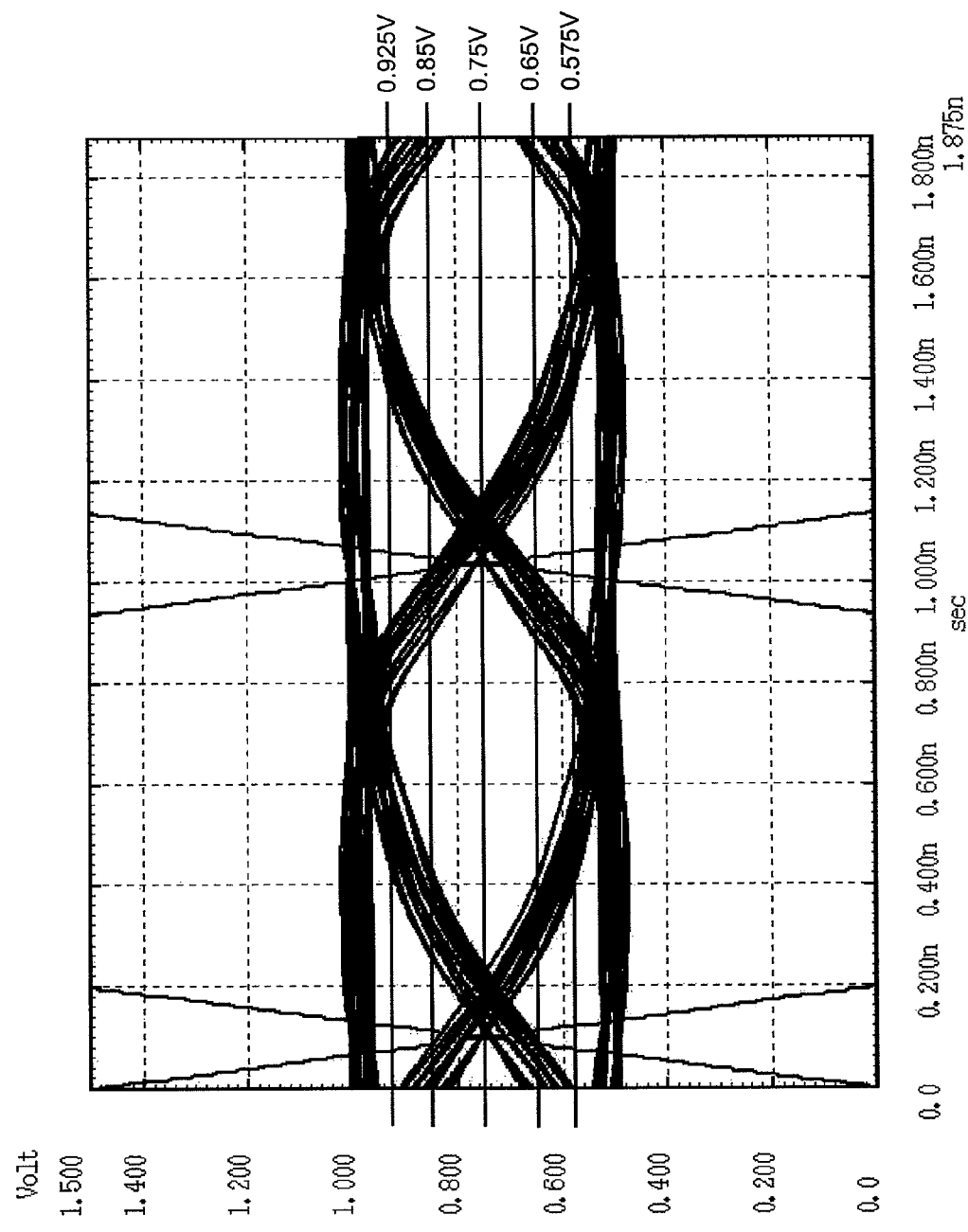
FIG. 12 is a graph showing the waveform at the time of writing in another slot in Example 4 of the present invention.

An Example for setting the terminal resistances for readout is now shown. The formulation of the memory system and the memory modules, data rate and the initial setting value of the terminal resistances by the mode register are the same as those of Example 3. Table 5 shows the setting of the enclosed terminal resistance for the memory chips of the DIMM0 and DIMM1 at the time of execution of the read command.

case, as found by simulation. In these figures, data is read out at a data rate of 1066 Mbps. The data rate is the same as that of Example 3. FIG. 11 depicts a signal waveform when data is read out from the lower layer memory chip (rank 1 or rank 3) of DIMM0. FIG. 12 depicts a signal waveform when data is read out from the lower layer memory chip (rank 1 or rank 3) of DIMM1. Comparison of FIGS. 11 and 12 indicates that, while the waveform for the memory chip of DIMM0 of FIG. 11 is not of a problem, the signal waveform for the memory chip of DIMM1 of FIG. 12 is slightly deteriorated.

Exemplary Embodiment 3

The Examples 3 and 4, which are species of the exemplary embodiment 2, are not of a problem if the data rate is suppressed to lower than a preset frequency. However, if the data rate is increased to realize an operation at a higher speed, it becomes difficult to write data to and read out data from the DIMM1 in stability in view of the longer length of the interconnection of the DQ system signal (data bus) from the memory controller. The exemplary embodiment 3 discloses a memory system with which data may be written to or read out from DIMM1 in stability at a higher data rate.

FIG. 13 depicts a schematic view showing a formulation of an entire memory system of the exemplary embodiment 3. The formulation of the memory module 7 is the same as that of the exemplary embodiments 1 and 2. The memory system of FIG. 13 differs from the corresponding memory module of the exemplary embodiment 2 of FIG. 8 in that, with the memory system of FIG. 13, the length of the data bus from the memory controller 1 to the memory module socket of DIMM0 and that from the memory controller 1 to the memory module socket of DIMM1 are set so as to be equal to each

TABLE 5

| | | | MCH | DDR3 DIMM ODT | | | | | | | |
|---|---|---|---|---|---|---|---|---|---|---|---|
| | | | | DIMM0 | | | | DIMM1 | | | |
| DIMM0 | DIMM1 | Read from | ODT | Rank 0 | Rank 1 | Rank 2 | Rank 3 | Rank 0 | Rank 1 | Rank 2 | Rank 3 |
| 4 Rank | 4 Rank | DIMM0-Rank 0 | 60 Ω | | OFF | | | 40 Ω | OFF | 40 Ω | OFF |
| | | DIMM0-Rank 1 | | | | | | 40 Ω | OFF | 40 Ω | OFF |
| | | DIMM0-Rank 2 | | | | | | 40 Ω | OFF | 40 Ω | OFF |
| | | DIMM0-Rank 3 | | | | | | 40 Ω | OFF | 40 Ω | OFF |
| | | DIMM1-Rank 0 | | 40 Ω | OFF | 40 Ω | OFF | | OFF | | |
| | | DIMM1-Rank 1 | | 40 Ω | OFF | 40 Ω | OFF | | | | |
| | | DIMM1-Rank 2 | | 40 Ω | OFF | 40 Ω | OFF | | | | |
| | | DIMM1-Rank 3 | | 40 Ω | OFF | 40 Ω | OFF | | | | |

(Remarks)
For both DIMM0 and DIMM1, Rtt_Nom for Ranks 0 and 2 is set to 40 Ω and Rtt_Nom for Ranks 1 and 3 is set to infinity, while Rtt_WR is unexceptionally set to 120 Ω.

For both the ranks 0 and 2 of DIMM0 and DIMM1, the terminal resistance values (Rtt_Npm) at the time other than the time of execution of the write command as set by the mode register is 40Ω. Also, for readout, the memory controller sets its own enclosed terminal resistance MCHODT to 60Ω. In executing a read command from the other DIMM, the memory controller affords the VDD level to the ODT terminal being controlled. In executing the read command from the DIMM being controlled, it affords the GND level. Thus, by on/off control by the ODT terminal by the memory controller and by resistance values as set beforehand by the mode register, the resistance values of the enclosed terminal resistances may be set as shown by the Table 5.

FIGS. 11 and 12 depict graphs showing waveforms at the data input/output terminal of the memory controller, for this other. The interconnection of the data bus of the motherboard of FIG. 8 is by the so-called fly-by system, whereas that of FIG. 13 is by the T-branch system. The interconnection of the data bus on the motherboard 3 is made up of a common data bus 41 routed from the memory controller 1 and branched data buses 42, 43 routed from the terminal end of the common data bus (branched point 44) to data bus connection terminals of the DIMM0 and DIMM1 memory module sockets. Component parts on the motherboard 3 are placed and routed so that the lengths of the branched data buses 42, 43 will be equal to each other and so that the capacitances and inductances of these data buses will be equal to each other. The lengths of the branched data buses 42, 43 are desirably as short as possible to prevent the 'stub' from being produced. This 'stub', which is signal reflections caused by non-terminated branched interconnects, may be produced in case the memory module is mounted on only one of the DIMM0 and DIMM1, as discussed subsequently.

Example 5

In this Example 5, the memory system and the memory module of the exemplary embodiment 3 are applied to DDR3 4-Rank Registered DIMM to write data in a memory chip. The setting of the terminal resistances is the same as that of Example 3 shown in Table 4. The sole difference of Example 5 from Example 3 is whether routing of a data bus on the motherboard is in accordance with the fly-by system or in accordance with the T-branch system.

Figure 14:
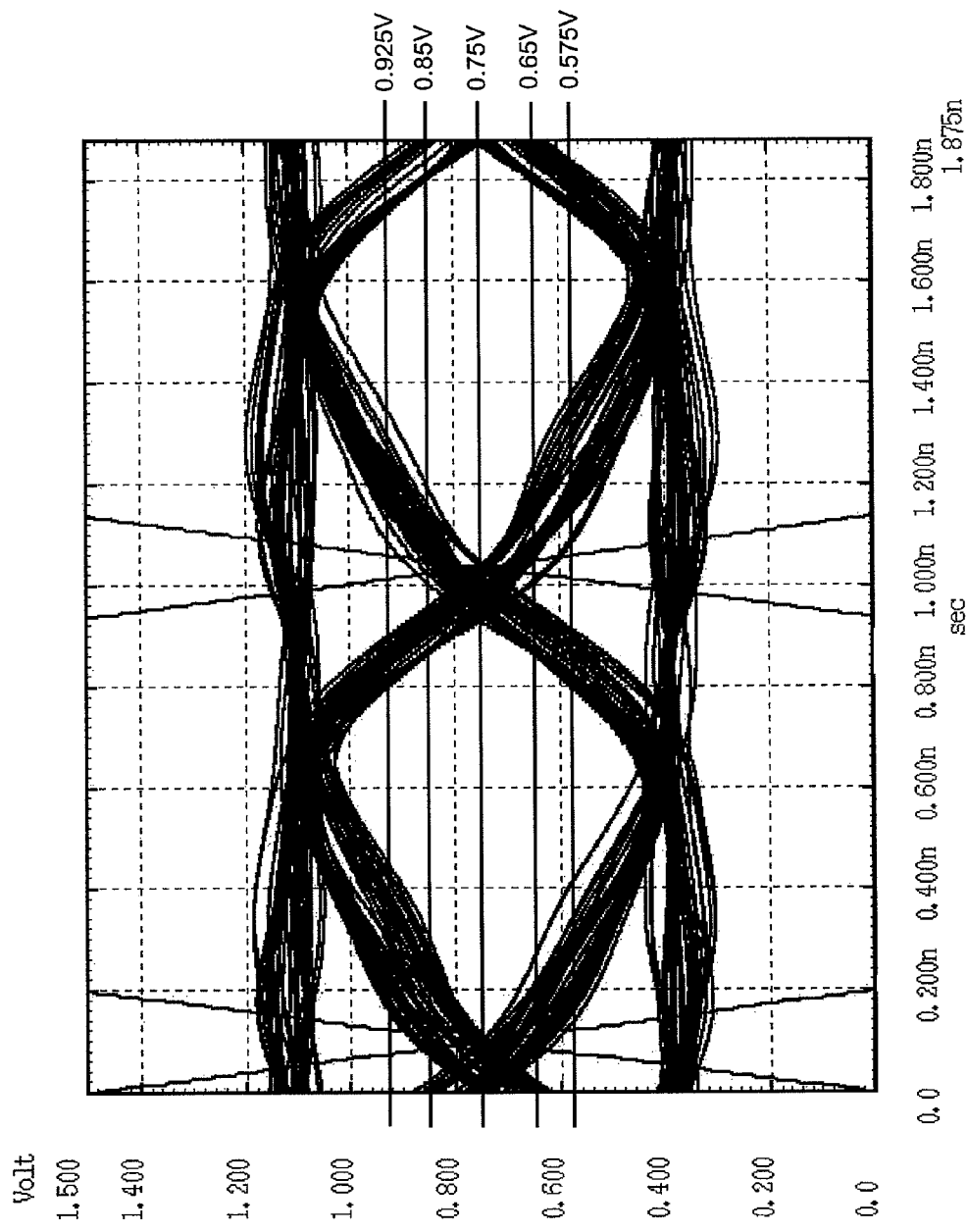
FIG. 14 is a graph showing the waveform at the time of writing in Example 5 of the present invention.

FIG. 14 is a graph, as obtained by simulation, showing a signal waveform of Example 5. Specifically, FIG. 14 shows a signal waveform at a data input/output pad of a memory chip being written to when executing a write command for the upper layer memory chip. In FIG. 14, the condition for simulation is the same as that of Example 3. Meanwhile, in Example 5, routing of the data bus on the motherboard is in accordance with the T-branch system, so that there is caused no difference between the signal waveform of DIMM0 and that of DIMM1. Comparison of FIG. 14 to FIG. 10 that shows a write waveform for the DIMM1 for Example 3 indicates that a wider eye pattern may be guaranteed with Example 5.

Example 6

In Example 6, the memory system and the memory module of Example 3 are applied to DDR3 4-Rank Registered DIMM and data is read out from the memory chip. The setting of the terminal resistances is the same as that of Example shown in Table 5. The sole difference of Example 6 from Example 4 is whether the routing of a data bus on the motherboard is in accordance with the fly-by system or in accordance with the T-branch system.

Figure 15:
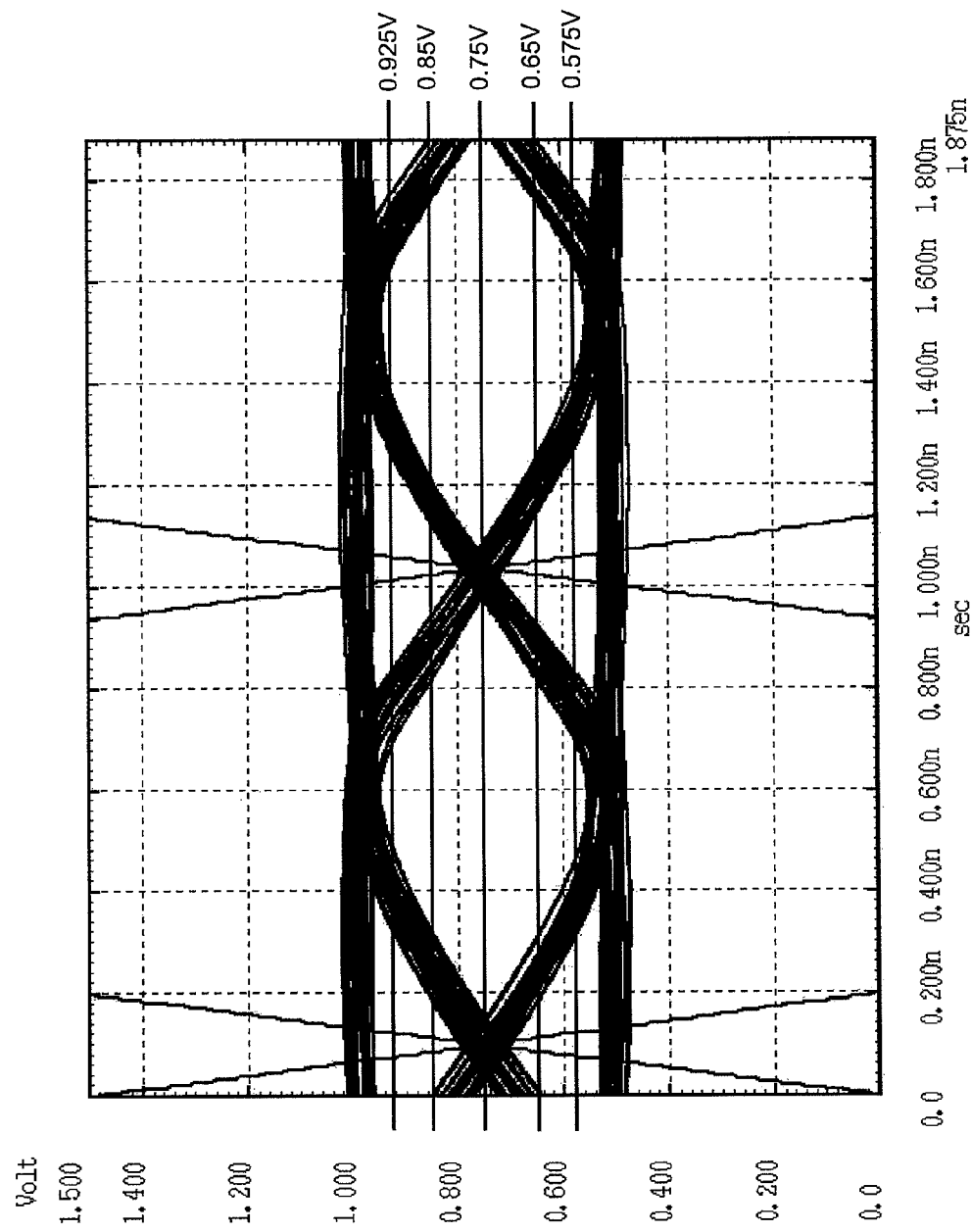
FIG. 15 is a graph showing the waveform at the time of readout in Example 6 of the present invention.

FIG. 15 is a graph, as obtained by simulation, showing a signal waveform of Example 6. Specifically, FIG. 14 shows a signal waveform at a data input/output terminal of a memory controller when executing a write command for the lower layer memory chip. Meanwhile, in Example 6, the data bus on the motherboard is routed in accordance with the T-branch system, so that there is caused no difference in signal waveform, such as is caused with Example 4, in dependence upon whether readout is from DIMM0 or from DIMM1. Comparison of FIG. 15 to FIG. 12 that shows a readout waveform for the DIMM1 for Example 4 indicates that a wider eye pattern may be guaranteed with Example 6.

Exemplary Embodiment 4

It has been realized that, in case a plurality of memory module sockets 5 are provided on the same memory bus on the motherboard, and the memory modules 7 are plugged into the total of the memory module sockets, as in Examples 5 and 6, routing in accordance with the T-branch system is more effective for a high-speed operation than that in accordance with the fly-by system.

Figure 16:
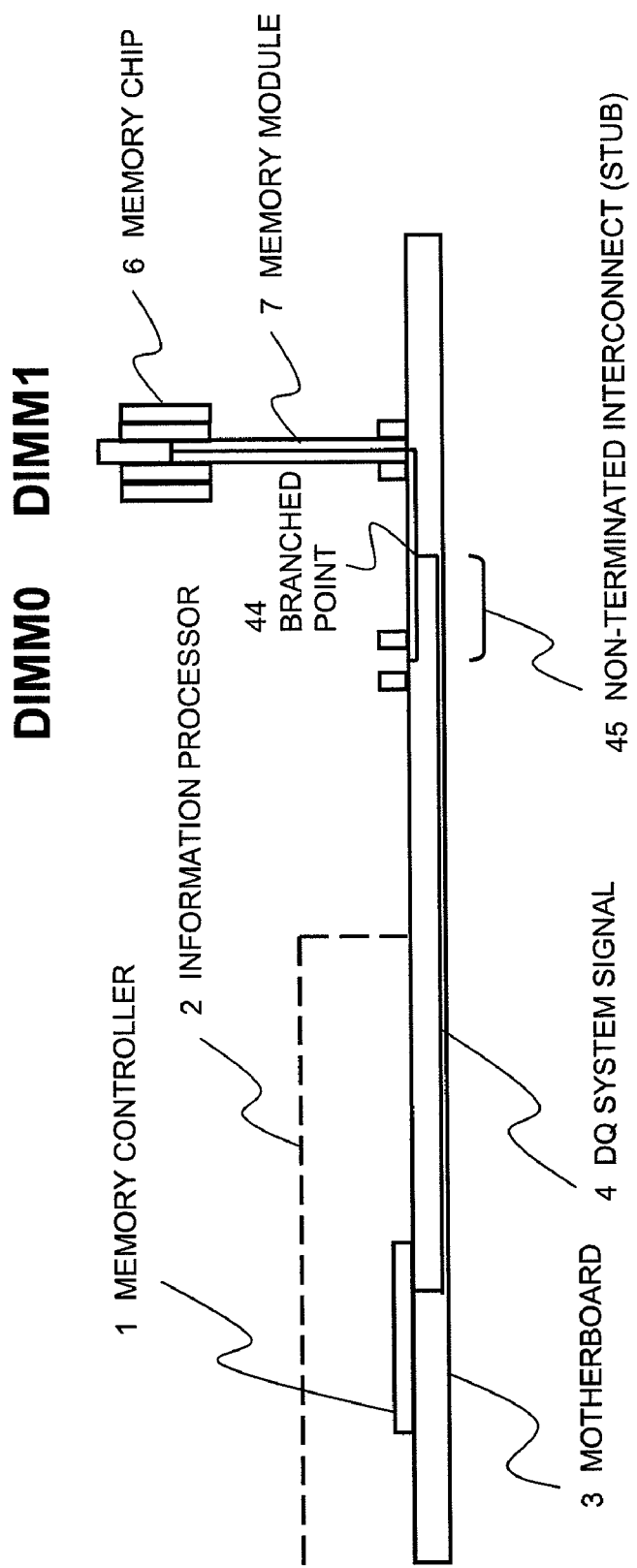
FIG. 16 is a schematic view of an entire memory system in case a memory module is plugged into only one slot in the other exemplary embodiment (T-branch system) of the present invention.

However, in case the data bus is routed in accordance with the T-branch system, and memory modules are not plugged into all of the memory module sockets 5 for memory modules, that is, so-called void slots are produced, there is fear that non-terminated data buses or 'stubs' may be produced. FIG. 16 depicts a schematic view showing an entire memory system in case a memory module has been plugged into only one slot of a motherboard the routing on which is in accordance with the T-branch system. In FIG. 16, the memory module 7 is plugged in only the DIMM1 memory module socket, while no memory module is plugged in the DMM0 memory module socket. Since the terminal end of the branched data bus from the branch point 44 to the DIMM0 memory module socket is open, there is produced a non-terminated bus ('stub') 45. Thus, for the case where there is a void slot in the memory module socket 5 for the memory module on the motherboard, the routing on which is in accordance with the T-branch system, the signal waveform is found by simulation to check to see that there is presented no problem.

Example 7

Figure 17:
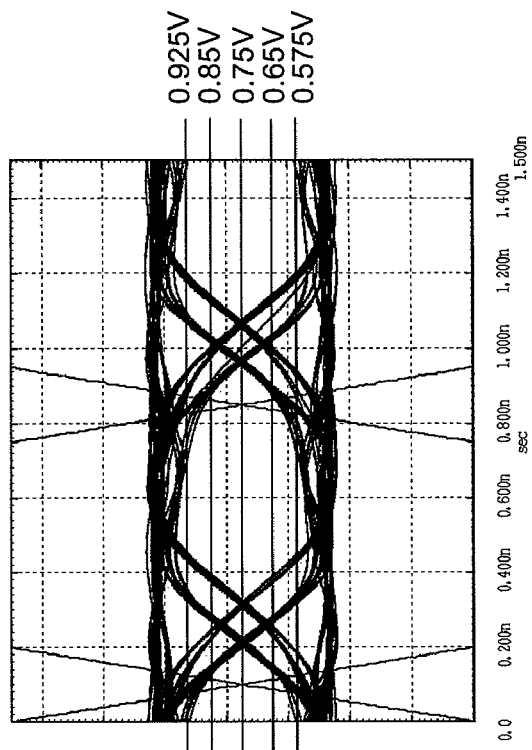
FIG. 17 is a graph showing the waveform at the time of writing in Example 7 of the present invention.
Figure 17:
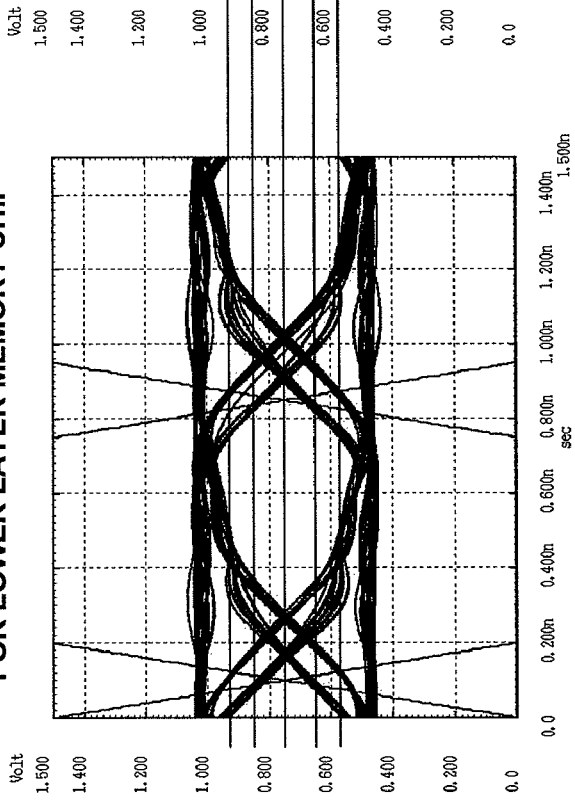

In Example 7, data has been written under the same condition as that of Example 1. The write condition is the same as that of Example 1. The sole difference from Example 1 is whether the data bus on the motherboard has been routed in accordance with the fly-by system or in accordance with the T-branch system. FIG. 17 shows a waveform in which data has been written under the same condition as that of FIG. 4 of Example 1. It is seen that no influence from the non-terminated bus ('stub') 45 may be noticed, so that there has been caused no problem.

Example 8

Figure 18:
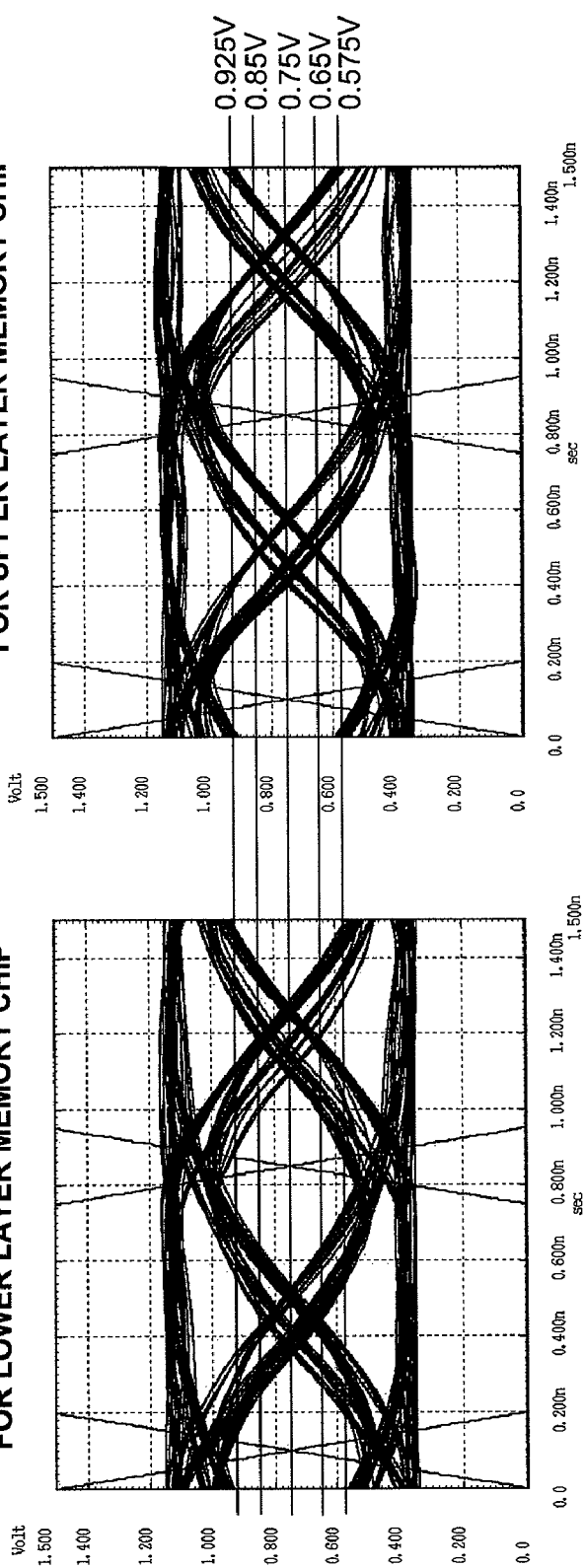
FIG. 18 is a graph showing the waveform at the time of readout in Example 8 of the present invention.

In Example 8, data has been written under the same condition as that of Example 2. The readout condition is the same as that of Example 2. The sole difference from Example 2 is whether the data bus on the motherboard has been routed in accordance with the fly-by system or in accordance with the T-branch system. FIG. 18 shows a waveform in which data has been read out under the same condition as that of FIG. 6 of Example 2. It is seen that there is no apparent influence from the non-terminated bus ('stub') 45 so that there has been caused no problem.

From the Examples 7 and 8, it has been found that no undesirable effects from the 'stubs' may be noticed even in case the data bus routing on the motherboard is by the T-branch system and the memory module is plugged only in a sole slot in the motherboard. Meanwhile, the stub length is on the order of 7 mm, however, the load is heavy with four ranks, and the tR/tF of the signal is not less than 400 ps, so that any adverse effects may be only small.

Comparative Example 2

Figure 19:
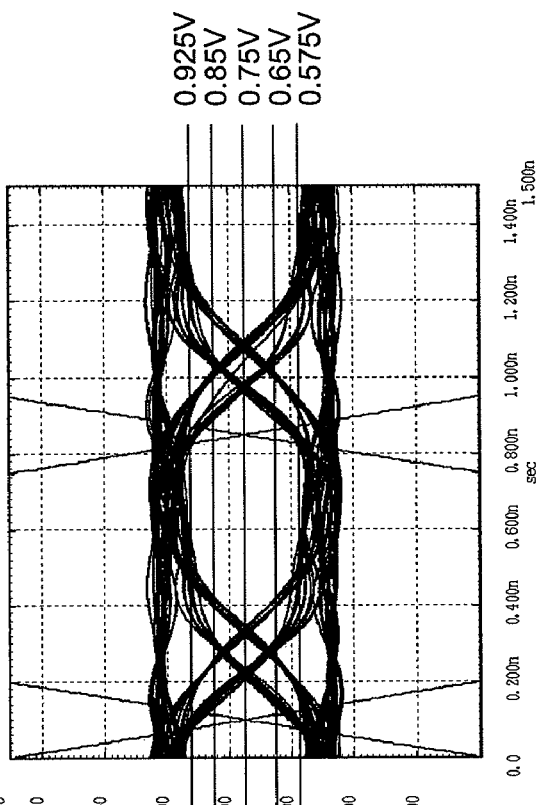
FIG. 19 is a graph showing the waveform at the time of writing in Comparative Example 2.
Figure 19:
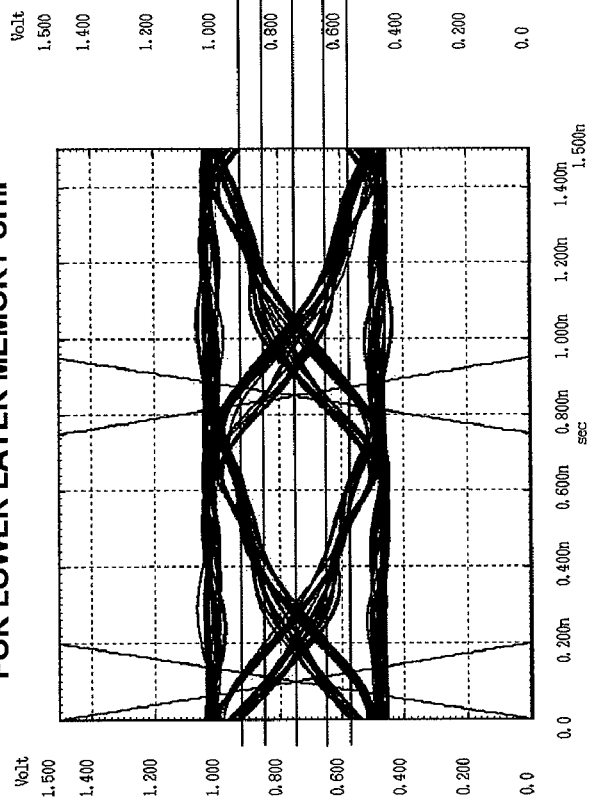

For reference, a simulation waveform obtained when the data bus is routed in accordance with the T-branch system and data has been written in the same memory module as that of the Comparative Example 1 is shown in FIG. 19. That is, with the memory module, shown in FIG. 23, the terminal resistance control pad 14 of the upper layer memory chip 12, having a longer length of the interconnection to the data bus, is fixed at VDD, while the terminal resistance control pad 14 of the lower layer memory chip 12, having a shorter length of the interconnection to the data bus, is connected to the terminal resistance control interconnects 18, 21. The condition for simulation is the same as that of FIG. 17 of Example 7. Comparison of FIG. 19 to FIG. 17 indicates that the eye pattern is narrower in FIG. 19. It has thus been confirmed that fixing the terminal resistance control pad 14 of the lower layer memory chip 11 having a shorter length of the interconnection to the data bus at VDD and connecting the terminal resistance control pad of the upper layer memory chip 12 having a longer length of the interconnection to the data bus to the terminal resistance control interconnects 18, 21 as shown in FIG. 2 is more desirable than using a motherboard on which data bus routing is in accordance with the T-branch system.

Reference Example 2

Figure 20:
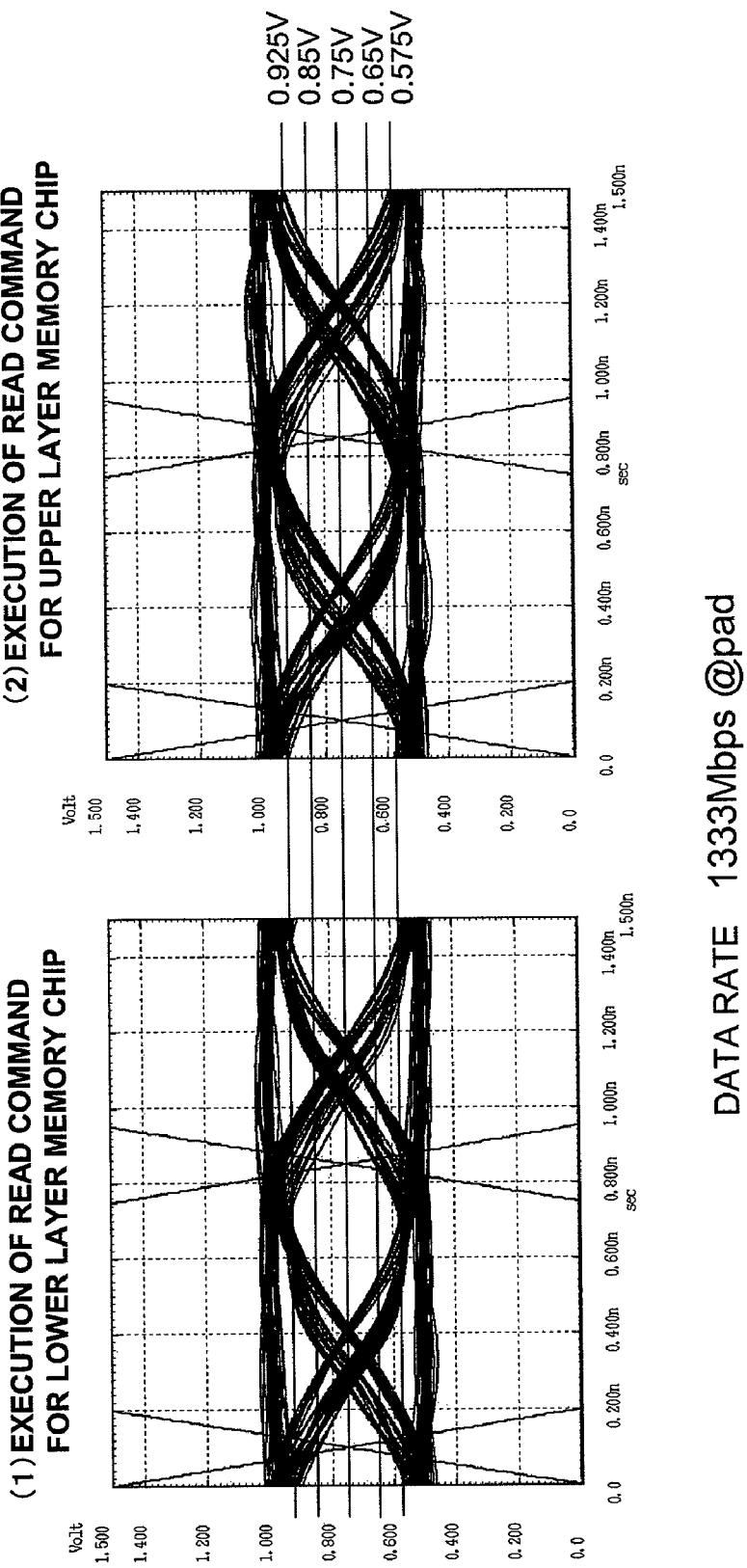
FIG. 20 is a graph showing the waveform at the time of readout in Reference Example 2 of the method of using the multi-rank memory module.

FIG. 20 shows a simulation waveform for the case in which a motherboard with data bus routing in accordance with the T-branch system is used, and in which data has been read out with the same setting of the enclosed terminal resistance as in Reference Example 1. Other conditions for simulation are the same as those of FIG. 18 of Example 8. Comparison of FIG. 20 to FIG. 18 of Example 8 indicates that the waveform of FIG. 18 is better than that of FIG. 20.

The above Examples are directed to a case where there are only two ODT terminals for the 4-rank memory module. The present invention is not limited to this case. If the number of the ODT terminals (terminal resistance control terminals) is lesser than that of the number of ranks, it is sufficient that the ODT terminals are allocated to the memory chips of the ranks in the order of decreasing lengths of the interconnections from the data bus of the module substrate to the data input/output pad of the memory chip, and that the terminal resistance control pads (ODT pads) of the memory chips of the ranks, the ODT terminals are not allocated to, are connected to a fixed potential in order to turn on the terminal resistances. In case memory chips are stacked on the module substrate in more than three tiers, it is sufficient that the ODT terminals are sequentially allocated beginning from the memory chip forming an upper layer towards the memory chips forming lower layers.

In the explanation of the above Examples, such a memory chip is shown which is designed and constructed so that the enclosed terminal resistances are turned on when the VDD level voltage is applied to the ODT pad and turned off when the GND level voltage is applied to the ODT pad. The present invention may also be applied to a reverse case where enclosed terminal resistance are turned on when the GND level voltage is applied to the ODT pad and turned off when the VDD level voltage is applied to the ODT pad. It should be noted that the resistance values shown in the respective Examples are for purposes of illustration only such that it is sufficient that the resistance values are set to optimum values in keeping with the design statements of the memory system or the memory module.

Although the present invention has been described with reference to Examples thereof, the present invention is not to be restricted to these Examples such that a variety of changes or corrections that may be achieved by those skilled in the art should be comprised within the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A multi-rank memory module comprising:
a module substrate;
a data bus provided on said module substrate;
a plurality of synchronous memory chips each including a data input/output pad connected via an interconnection to said data bus, an enclosed terminal resistance that terminates connection to said data bus, and a terminal resistance control pad for inputting a signal that controls the on/off of said enclosed terminal resistance; said synchronous memory chips being provided in terms of a rank as a unit of said memory chips to which a command is afforded independently from outside;
a number of terminal resistance control terminals smaller than that of said ranks; and
a number of terminal resistance control interconnects each provided on said module substrate in association with each of said terminal resistance control terminals;
wherein
a terminal resistance control pad for the memory chip out of said memory chips that has a shorter length of said interconnection is connected to a fixed potential to turn on said enclosed terminal resistance; and wherein
a terminal resistance control pad of the memory chip out of said memory chips that has a longer length of the interconnection is connected to said terminal resistance control interconnect.

2. The multi-rank memory module according to claim 1 wherein each of said memory chips includes a chip select terminal; and wherein
said memory module receives a chip select signal, received from outside, to select a chip select terminal of one of said memory chips that is to receive a command.

3. The multi-rank memory module according to claim 1 further comprising:
a register for storage of signals including an address and a command, received from outside, and a phase synchronization circuit that adjusts the timing of said signals stored in said register to afford the resulting signals to said memory chips; wherein
said terminal resistance control terminals are connected via said register to said terminal resistance control interconnects.

4. A multi-rank memory module comprising:
a module substrate;
a data bus provided on said module substrate;
a plurality of synchronous memory chips each including a data input/output pad connected to said data bus, an enclosed terminal resistance that terminates connection to said data bus, and a terminal resistance control pad for inputting a signal that controls the on/off of said enclosed terminal resistance; said synchronous memory chips being provided in terms of a rank as a unit of said memory chips to which a command is afforded independently from outside; said synchronous memory chips being loaded in a plurality of layers on said module substrate;
a number of terminal resistance control terminals smaller than that of said ranks; and
a number of terminal resistance control interconnects each provided on said module substrate in association with each of said terminal resistance control terminals;
wherein
a terminal resistance control pad of the memory chip out of said memory chips that is disposed on a lower layer close to said module substrate is connected to a fixed potential to turn on said enclosed terminal resistance; and wherein
a terminal resistance control pad for the memory chip out of said memory chips that is disposed at an upper layer is connected to said terminal resistance control interconnects.

5. The multi-rank memory module according to claim 4 wherein said terminal resistance control pads of said memory chips are stacked in layers on front and back sides of said module substrate, said terminal resistance control pads of said memory chips provided on respective lower layers of said front and back sides are connected to said fixed potential, and wherein said terminal resistance control pads of said memory chips provided on respective upper layers of said front and back sides are connected to respective corresponding terminal resistance control interconnects.

6. The multi-rank memory module according to claim 4 wherein said memory chips stacked in layers are arranged in a package and mounted in this state on said substrate, and wherein said data input/output pad is connected to a data input/output terminal of said package and connected via said input/output terminal of said package to said data bus.

7. The multi-rank memory module according to claim 2 wherein each of said memory chips includes a chip select terminal; and wherein
said memory module receives a chip select signal, received from outside, to select a chip select terminal of one of said memory chips that is to receive a command.

8. The multi-rank memory module according to claim 2 further comprising:
a register for storage of signals including an address and a command, received from outside, and a phase synchronization circuit that adjusts the timing of said signals stored in said register to afford the resulting signals to said memory chips; wherein
said terminal resistance control terminals are connected via said register to said terminal resistance control interconnects.

9. A method for using the multi-rank memory module according to claim 1, wherein each of said memory chips further includes a mode register that sets a resistance value of said enclosed terminal resistance at the time of execution of a write command and a resistance value of said enclosed terminal resistance at the time other than the time of execution of the write command; and wherein
the value of said terminal resistance of said memory chip, the terminal resistance control pad of which has been connected to a fixed potential, is set beforehand in said mode register so that said value of said terminal resistance at a time other than the time of execution of the write command is infinity and said value of said terminal resistance at the time of execution of said write command is a first value smaller than infinity; and wherein, in use, said value of said terminal resistance is set to said first value at the time of execution of said write command and said value of said terminal resistance is set to infinity at a time other than the time of execution of said write command.

10. The method for using the multi-rank memory module according to claim 9 wherein the value of a terminal resistance of said memory chip, the terminal resistance control pad of which has been connected to a terminal resistance control interconnect, is set beforehand in said mode register so that said value of said terminal resistance at the time other than the time of execution of a write command is a second value smaller than said first value and so that said value of said terminal resistance at the time of execution of said write command is said first value; and wherein
said terminal resistance control terminal is controlled to turn off said enclosed terminal resistance at the time of execution of a read command for any rank of said memory module.

11. A memory system comprising:
an interconnect substrate;
an information processor mounted on said interconnect substrate and including a memory controller;
a multi-rank memory module; and
a plurality of memory module sockets for plugging-in of said multi_rank memory module; the multi-rank memory module being plugged-in at least one of said memory module sockets;
wherein said multi-rank memory module includes;
a module substrate;
a data bus provided on said module substrate;
a plurality of synchronous memory chips each including a data input/output pad connected to said data bus, an enclosed terminal resistance that terminates connection to said data bus, and a terminal resistance control pad for inputting a signal that controls the on/off of said enclosed terminal resistance; said synchronous memory chips being provided in terms of a rank as a unit of said memory chips to which a command is afforded independently from outside;
a number of terminal resistance control terminals smaller than that of said ranks; and
a number of terminal resistance control interconnects each provided on said module substrate in association with each of said terminal resistance control terminals;
wherein said plurality of synchronous memory chips includes;
a first memory chip said terminal resistance control pad of which is fixed potential to turn on said enclosed terminal resistance; and
a second memory chip said terminal resistance control pad of which is connected to said terminal resistance control interconnect; and
wherein said interconnect substrate includes a common data bus routed from said memory controller and a plurality of branched data buses routed from the terminal end of said common data bus to data bus connection terminals of said memory module sockets; the interconnect lengths of said branched data buses being equal to one another.

12. The memory system according to claim 11 wherein each of said memory chips further includes a mode register that sets the terminal resistance value of said enclosed terminal resistance at the time of execution of a write command and the resistance value of said enclosed terminal resistance at the time other than the time of execution of a write command; wherein
said information processor includes an initial setting section that sets a resistance value of said enclosed terminal resistance in said mode register at the time of initial setting of said memory system; and wherein
said initial setting section initial-sets said mode register so that, for the memory chip the terminal resistance control pad of which is connected to a fixed potential, the terminal resistance value at the time other than the time of execution of a write command is infinity and the terminal resistance value at the time of execution of said write command is a first value smaller than said infinity.

13. The memory system according to claim 11 wherein, for said mode register of said memory chip the terminal resistance control pad of which is connected to a terminal resistance control interconnect of said memory module, said initial setting section initial-sets the terminal resistance value at the time other than time of execution of a write operation to a second value smaller than said first value; said initial setting section also initial-setting the terminal resistance at the time of execution of said write command to said first value; and wherein said information processor includes a terminal resistance control section that controls the terminal control terminal of said memory module so that said enclosed terminal resistance will be turned off at the time of execution of a read command for any rank of said memory module.

14. The memory system according to claim 11 wherein said data input/output pad of each memory chips is connected to said data bus provided on said module substrate via an interconnection, and wherein an interconnection of said first memory chip has a shorter length than an interconnection of said second memory chip.

15. The memory system according to claim 11 wherein said first memory chip and said second memory chip are loaded in layers on said module substrate, and wherein said second memory chip is mounted on said first memory chip.

* * * * *